United States Patent
Morris, III et al.

(10) Patent No.: US 8,891,223 B2
(45) Date of Patent: Nov. 18, 2014

(54) MICRO-ELECTRO-MECHANICAL SYSTEM (MEMS) VARIABLE CAPACITORS AND ACTUATION COMPONENTS AND RELATED METHODS

(75) Inventors: Arthur S. Morris, III, Raleigh, NC (US); John Qiang Huang, Irvine, CA (US)

(73) Assignee: Wispry, Inc., Irvine, CA (US)

( * ) Notice: Subject to any disclaimer, the term of this patent is extended or adjusted under 35 U.S.C. 154(b) by 0 days.

(21) Appl. No.: 12/480,027

(22) Filed: Jun. 8, 2009

(65) Prior Publication Data

US 2009/0296309 A1    Dec. 3, 2009

Related U.S. Application Data

(62) Division of application No. 11/715,676, filed on Mar. 8, 2007, now Pat. No. 7,545,622.

(60) Provisional application No. 60/780,565, filed on Mar. 8, 2006.

(51) Int. Cl.
| | |
|---|---|
| H01G 5/16 | (2006.01) |
| H01G 5/00 | (2006.01) |
| H03H 7/46 | (2006.01) |
| H03H 7/38 | (2006.01) |
| H01G 5/18 | (2006.01) |
| H01G 4/38 | (2006.01) |

(52) U.S. Cl.
CPC .............. *H03H 7/38* (2013.01); *H03H 7/463* (2013.01); *H01G 5/18* (2013.01); *H01G 4/38* (2013.01)
USPC .......................................... 361/290; 361/277

(58) Field of Classification Search
CPC ............. H01G 5/18; H01G 5/16; H01G 5/38; H01G 5/011; H03H 7/38; H03H 7/463
USPC .......................... 361/277, 278, 281, 287, 290
See application file for complete search history.

(56) References Cited

U.S. PATENT DOCUMENTS

| | | | |
|---|---|---|---|
| 4,015,223 A | | 3/1977 | Cheze |
| 6,040,611 A | * | 3/2000 | De Los Santos et al. ..... 257/415 |

(Continued)

FOREIGN PATENT DOCUMENTS

| | | |
|---|---|---|
| CN | 2279688 | 4/1998 |
| CN | 1211052 | 3/1999 |

OTHER PUBLICATIONS

Young et al., A Micromachine-Based RF Low-Noise Voltage-Controlled Oscillator, 1997, Custom Integrated Circuits Conference, 1997., Proceedings of the IEEE 1997, 431-434.*

(Continued)

*Primary Examiner* — David M Sinclair
(74) *Attorney, Agent, or Firm* — Jenkins, Wilson, Taylor & Hunt, P.A.

(57) ABSTRACT

Micro-electro-mechanical system (MEMS) variable capacitors and actuation components and related methods are provided. A MEMS variable capacitor can include first and second feed lines extending substantially parallel to one another. Further, MEMS variable capacitors can include first and second capacitive plates being spaced apart from the first and second feed lines. The first and second capacitive plates can be separately movable with respect to at least one of the first and second feed lines for varying the capacitance between the first and second feed lines over a predetermined capacitance range.

11 Claims, 28 Drawing Sheets

(56) References Cited

U.S. PATENT DOCUMENTS

| | | | |
|---|---|---|---|
| 6,210,988 B1* | 4/2001 | Howe et al. | 438/50 |
| 6,226,168 B1 | 5/2001 | Shibata | |
| 6,466,102 B1* | 10/2002 | Grant et al. | 333/105 |
| 6,507,475 B1 | 1/2003 | Sun | |
| 6,727,778 B2* | 4/2004 | Kudrle et al. | 333/33 |
| 6,815,739 B2* | 11/2004 | Huff et al. | 257/275 |
| 6,972,635 B2* | 12/2005 | McCorquodale et al. | 331/167 |
| 7,045,440 B2* | 5/2006 | Huff et al. | 438/456 |
| 7,157,984 B2* | 1/2007 | McCorquodale et al. | 331/167 |
| 7,212,091 B2* | 5/2007 | Andricacos et al. | 335/78 |
| 7,244,125 B2* | 7/2007 | Brown et al. | 439/66 |
| 7,265,647 B2* | 9/2007 | Qian et al. | 333/262 |
| 7,358,915 B2* | 4/2008 | Legay et al. | 343/768 |
| 7,541,898 B2* | 6/2009 | Qian et al. | 333/262 |
| 7,583,168 B2* | 9/2009 | Kawai et al. | 333/238 |
| 2002/0000364 A1* | 1/2002 | Hong et al. | 200/181 |
| 2003/0214373 A1* | 11/2003 | Andricacos et al. | 335/78 |
| 2004/0000948 A1 | 1/2004 | Stengel | |
| 2004/0207486 A1 | 10/2004 | York | |
| 2005/0184833 A1 | 8/2005 | Higgins et al. | |
| 2006/0238951 A1* | 10/2006 | Cetiner et al. | 361/160 |

OTHER PUBLICATIONS

Notification of Grant for Chinese Patent Application No. 2007/80016273.3 dated Jun. 24, 2011.

Certificate of Patent for Chinese Patent Application Serial No. CN ZL 200780016273.3 dated Nov. 10, 2011.

Chinese Office Action for Application No. 201110252887.X dated Nov. 4, 2013.

Chinese Office Action (English Translation) corresponding to Chinese Patent Application No. 200780016273.3 dated Aug. 12, 2010.

* cited by examiner

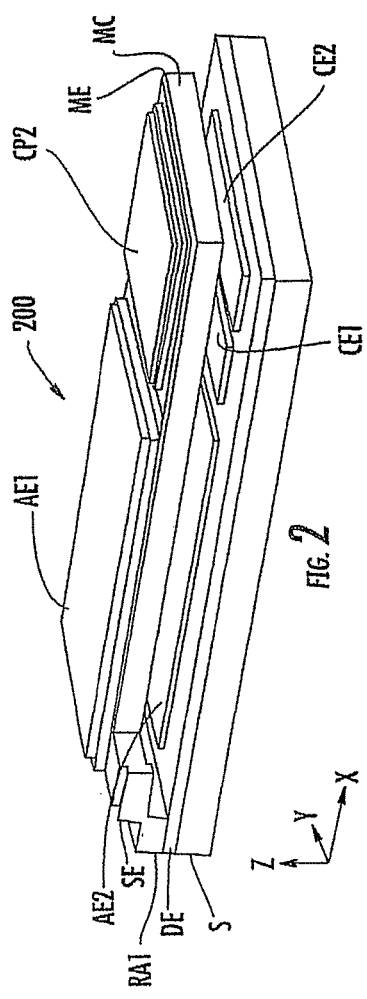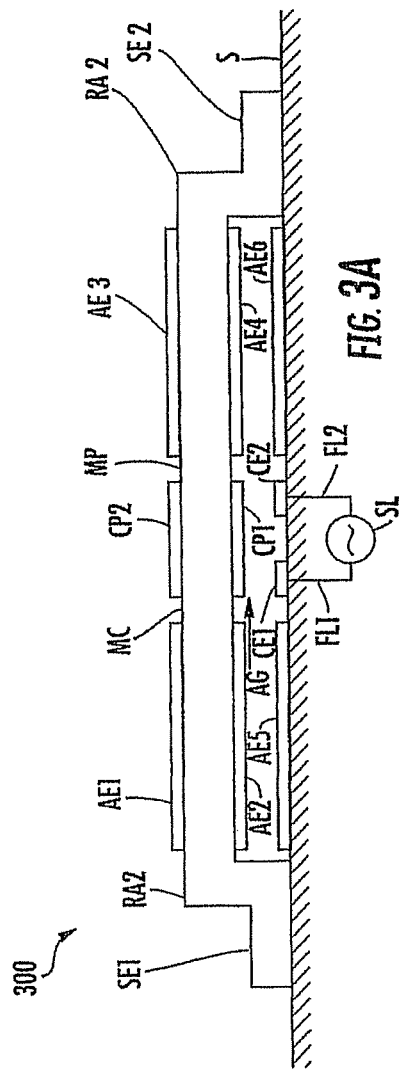

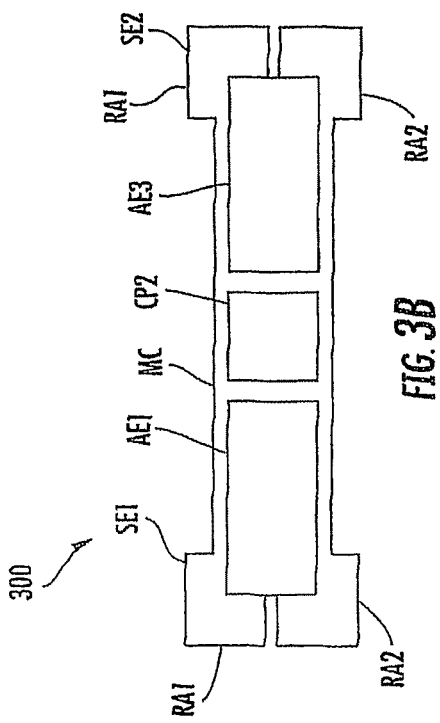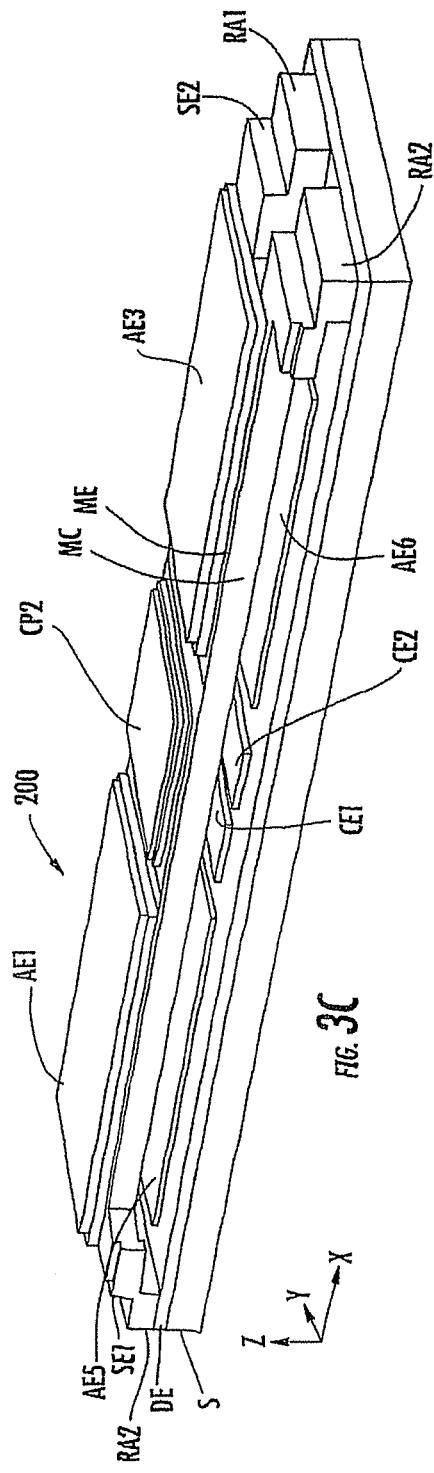

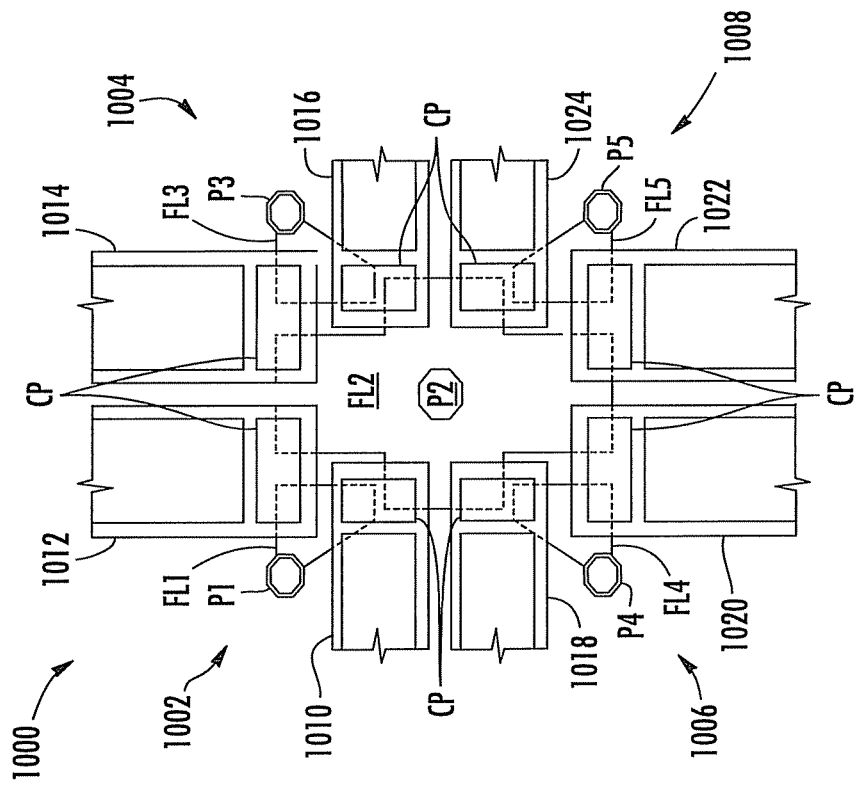
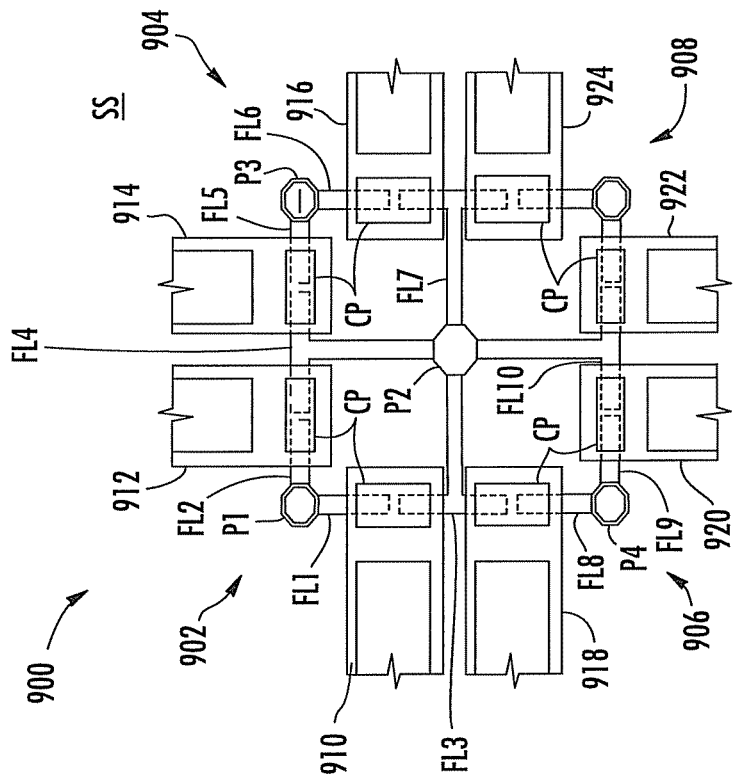
FIG. 10
FIG. 9

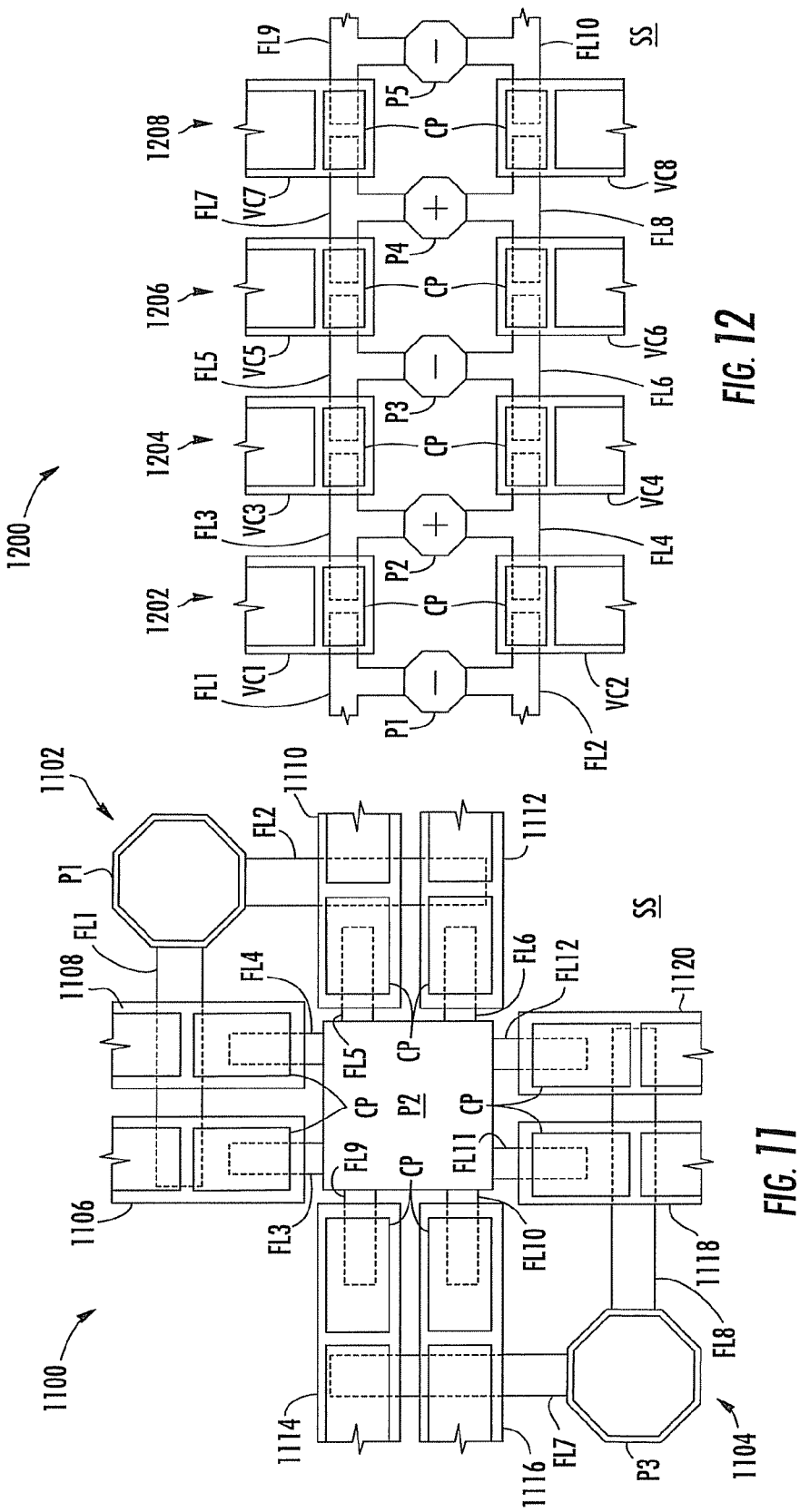

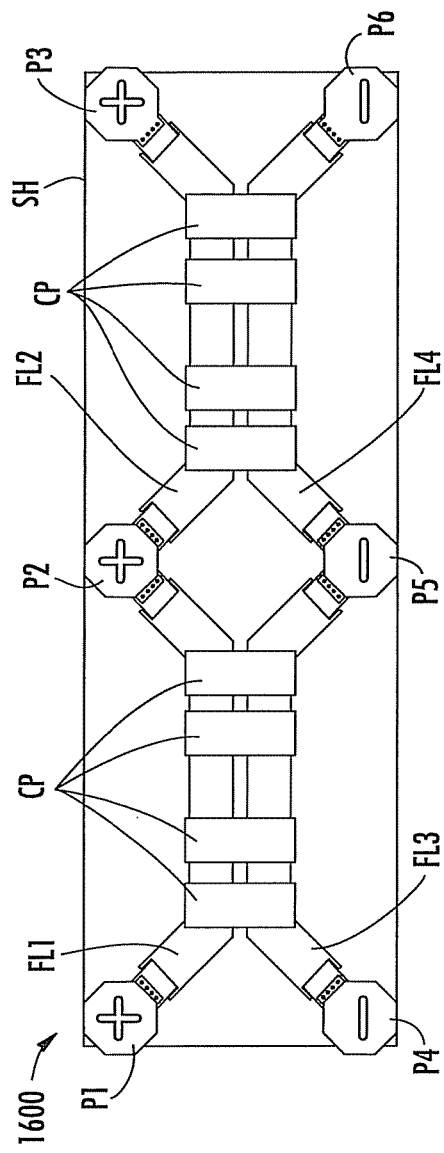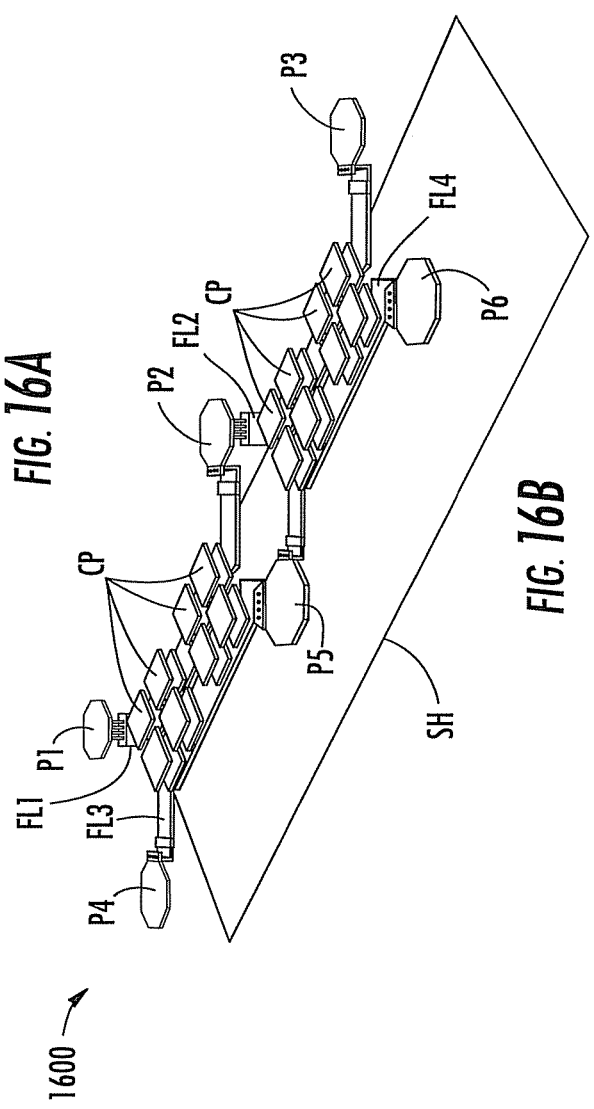
FIG. 16A
FIG. 16B

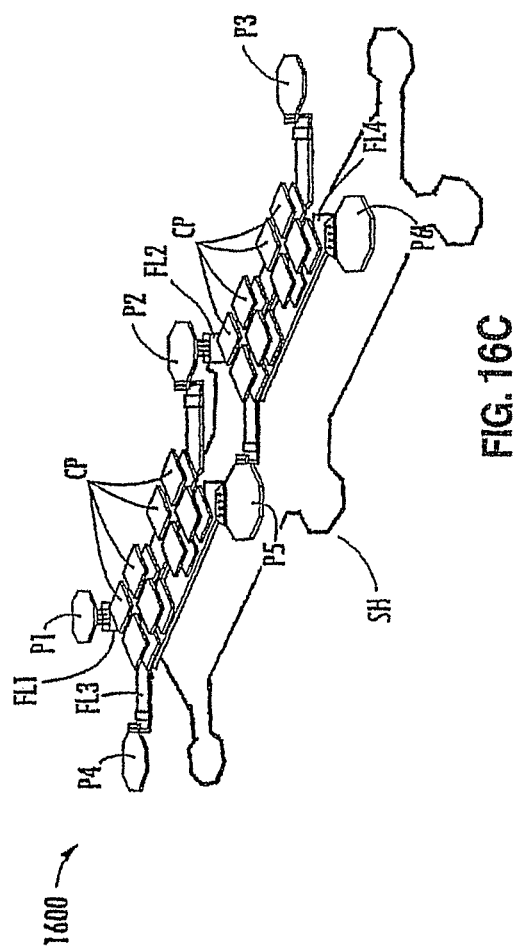

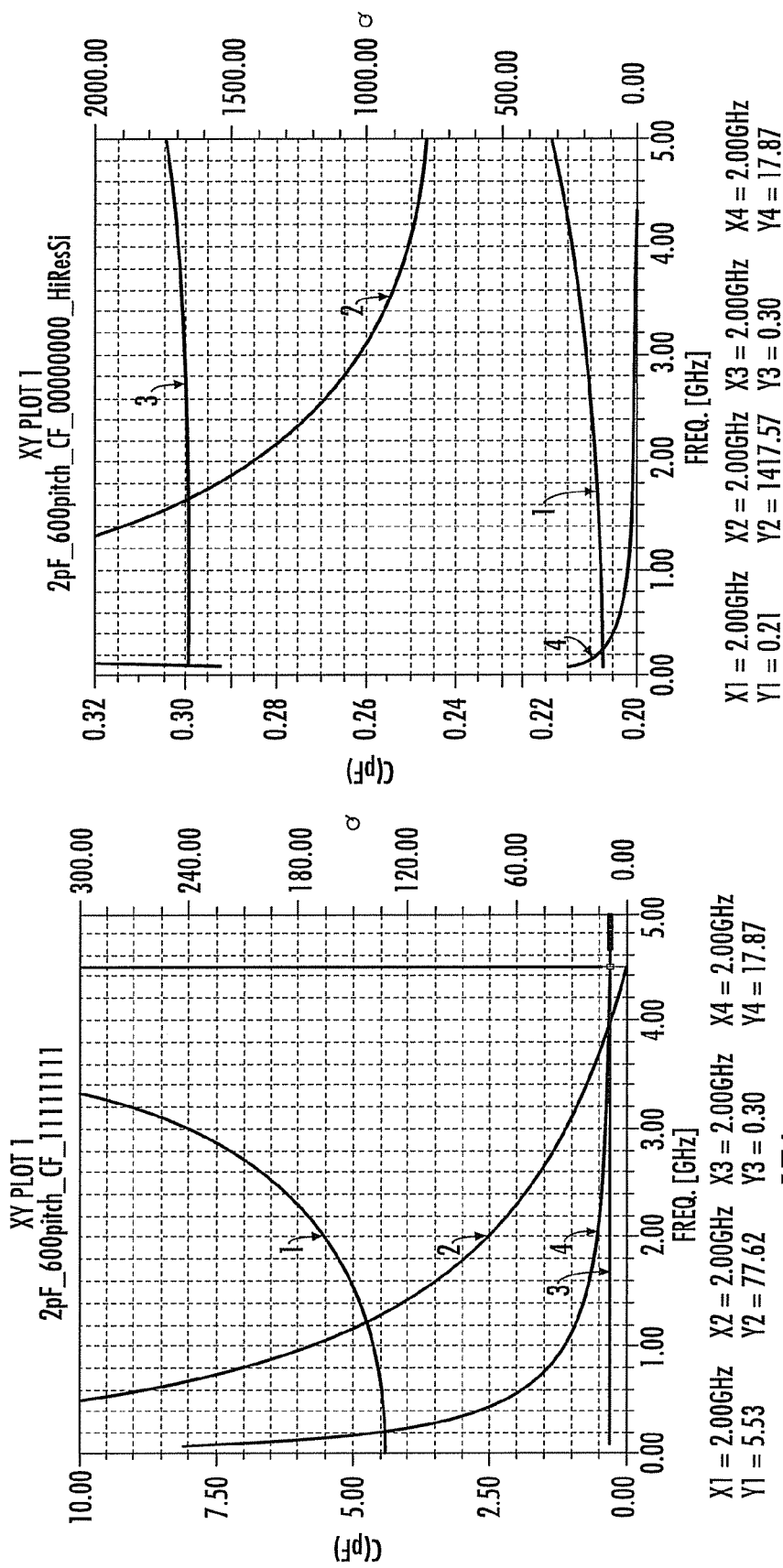

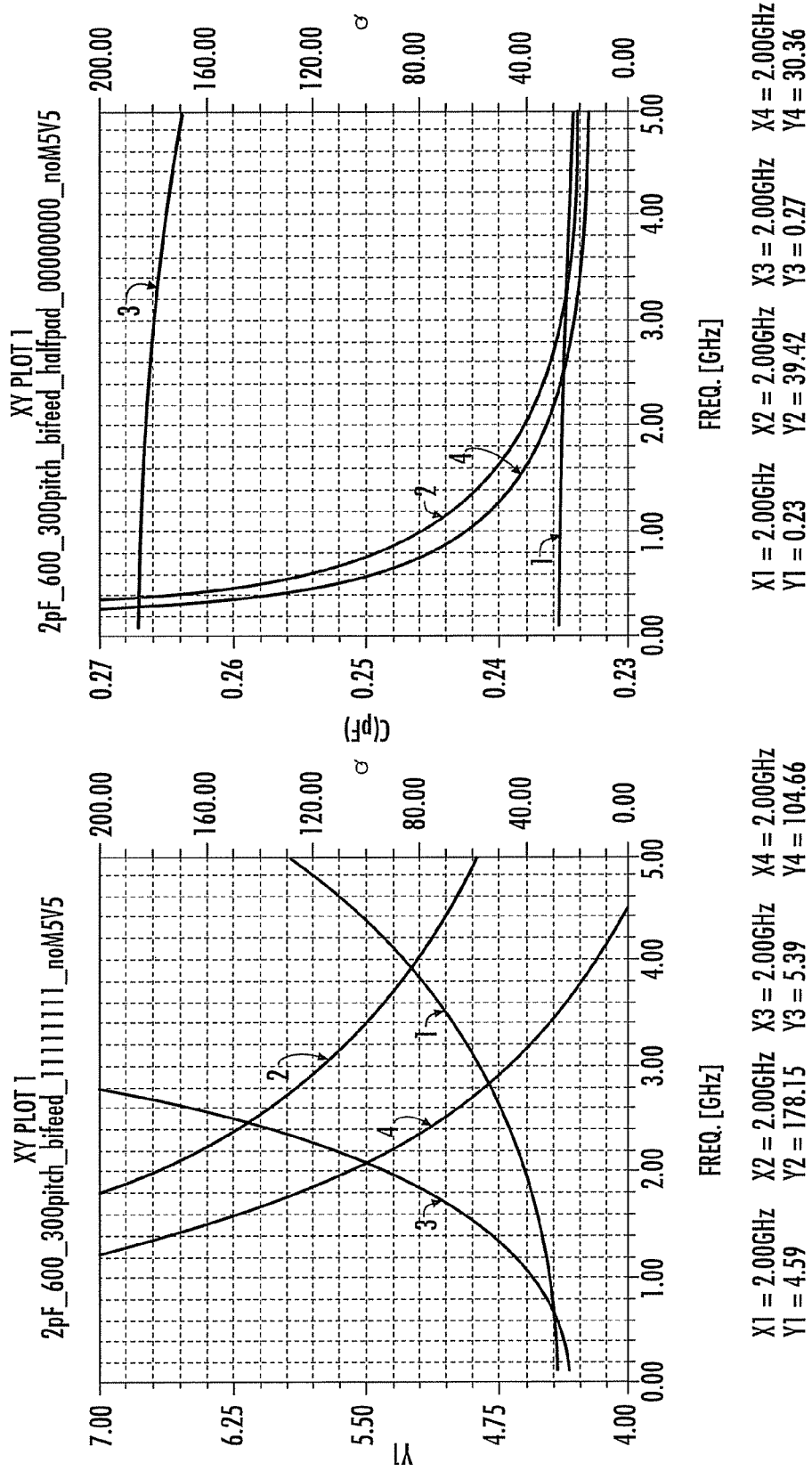

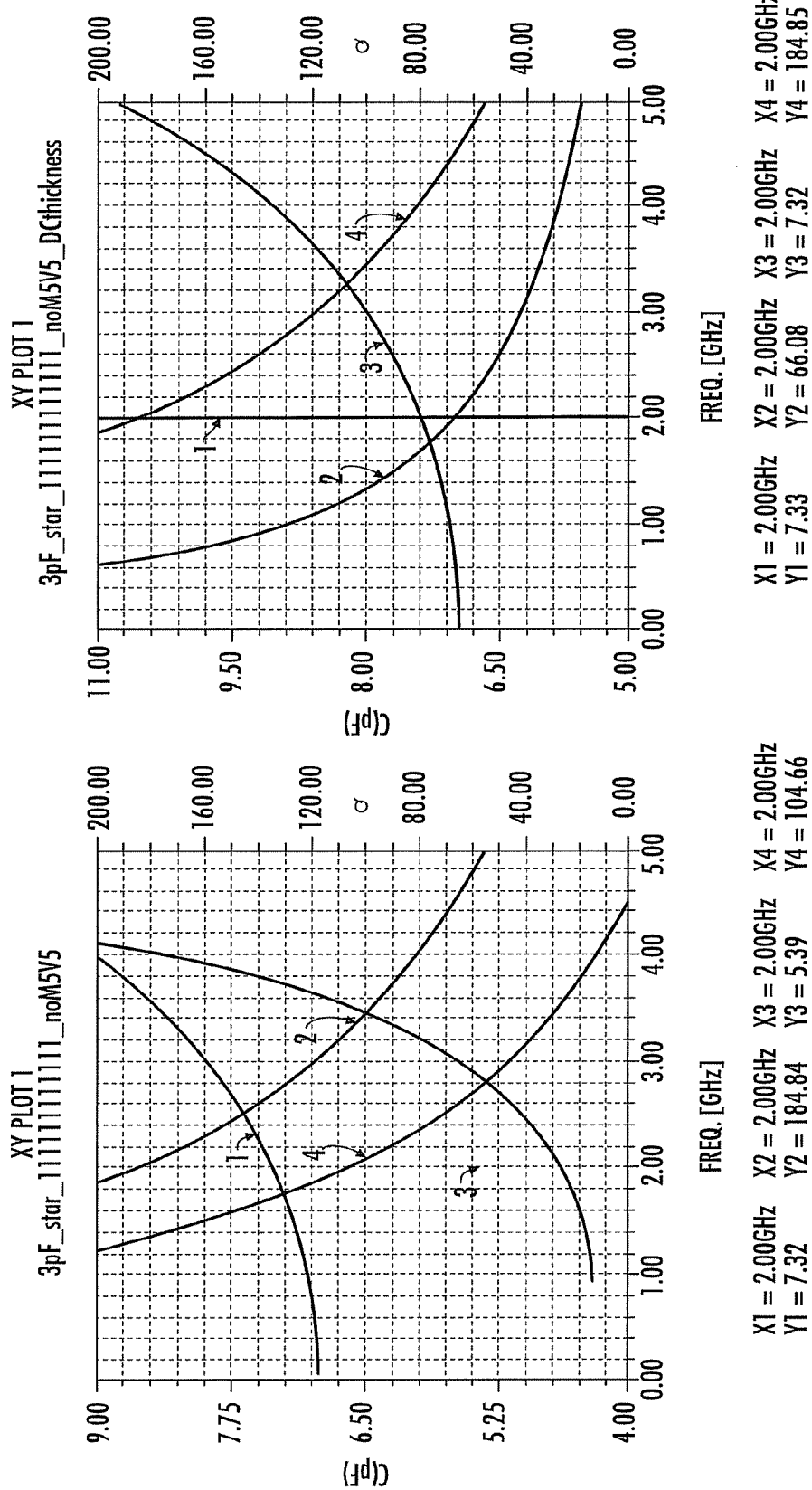

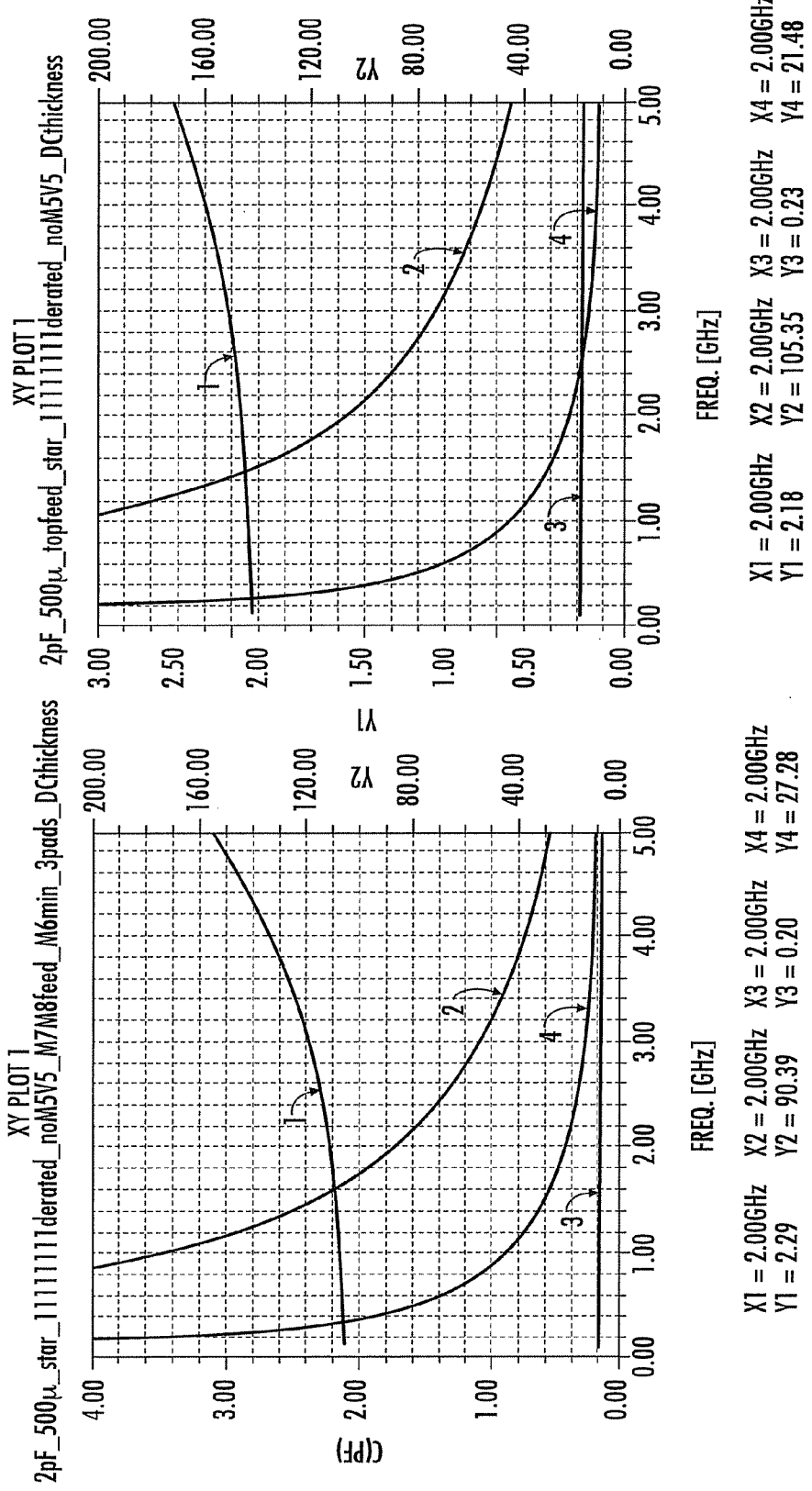

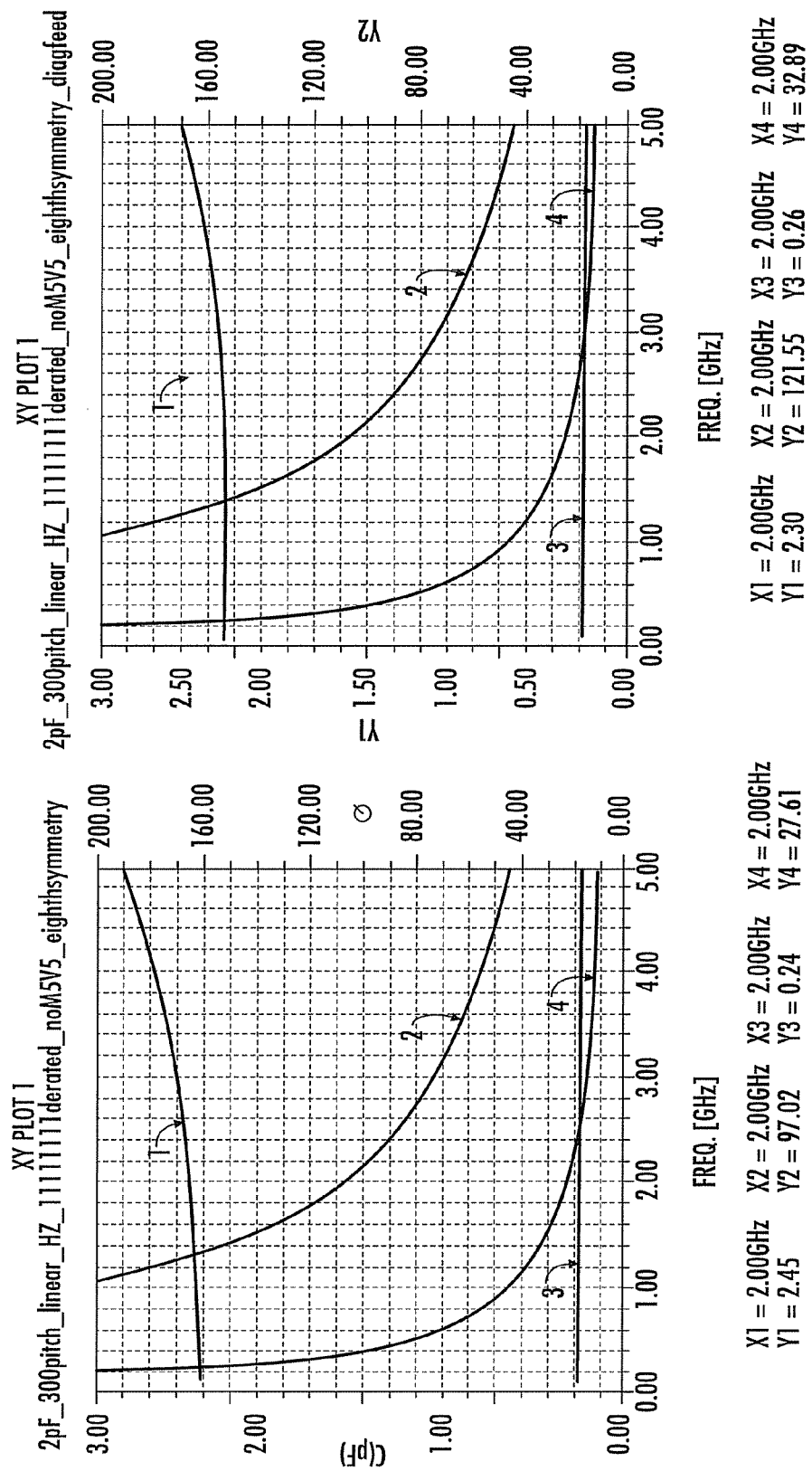

MICRO-ELECTRO-MECHANICAL SYSTEM (MEMS) VARIABLE CAPACITORS AND ACTUATION COMPONENTS AND RELATED METHODS

RELATED APPLICATIONS

This application is a divisional patent application from U.S. patent application Ser. No. 11/715,676, filed Mar. 8, 2007, now U.S. Pat. No. 7,545,622, from U.S. Provisional Patent Application Ser. No. 60/780,565, filed Mar. 8, 2006, and the disclosures of which are incorporated herein by reference in their entireties.

TECHNICAL FIELD

The subject matter disclosed herein relates generally to MEMS components. More particularly, the subject matter disclosed herein relates to MEMS variable capacitors and actuation components and methods.

BACKGROUND

MEMS have been shown to be useful for a variety of consumer, industrial and military applications. Most MEMS devices are fabricated on semiconductor substrates (e.g., silicon, Gallium Arsenide, Silicon-On-Insulator, etc.) using standard Integrated Circuit (IC) processes in combination with specialized micromachining processes. Collectively these manufacturing technologies are frequently called microfabrication processes.

Recently there has been a large interest in making MEMS Radio Frequency (RF) devices and systems for a variety of high volume communication applications. MEMS-based RF components and systems have typically been realized on traditional semiconductor materials, primarily silicon wafers, due to the high quality of the materials and processes developed over the years and due to the expectation of direct monolithic integration of the MEMS with integrated circuits. This approach has several disadvantages for the performance and potential commercialization of RF and microwave devices. In particular, the dielectric losses of the silicon substrate are very high at at frequencies above 1 GHz and high metallization sheet resistances. Further, such MEMS components can produce RF interference into underlying and surrounding circuitry and vice versa.

There is also a benefit in producing MEMS variable capacitors that meet certain performance requirements. For example, there is a desire to provide MEMS variable capacitors having high quality factor (Q) over a range of different frequencies. Also, there is a desire to provide MEMS variable capacitors with improved capacitance ratio (the ratio of minimum to maximum capacitance of a variable capacitor). The capacitance ratio may be achieved by providing variable capacitors with a minimized parasitic fixed capacitance and maximized capacitance in the high capacitance state. It is also desired to highly isolate the RF portions of the MEMS circuits from the substrate noise and losses.

In view of the foregoing, it is desired to provide improved MEMS variable capacitors and actuation components and methods.

SUMMARY

In accordance with this disclosure, novel MEMS variable capacitors and actuation components and related methods are provided.

It is an object of the present disclosure therefore to provide novel MEMS variable capacitors and actuation components and related methods. This and other objects as may become apparent from the present disclosure are achieved, at least in whole or in part, by the subject matter described herein.

BRIEF DESCRIPTION OF THE DRAWINGS

The subject matter described herein will now be explained with reference to the accompanying drawings of which:

FIG. 2 is a top perspective view of a MEMS variable capacitor according to one embodiment of the subject matter described herein;

FIGS. 3A-3C are different views of a MEMS variable capacitor according to one embodiment of the subject matter described herein;

FIG. 9 is a top view of a MEMS variable capacitor system having MEMS variable capacitors and feed lines according to an embodiment of the subject matter described herein;

FIG. 10 is a top view of a MEMS variable capacitor system having MEMS variable capacitors and feed lines according to an embodiment of the subject matter described herein;

FIG. 11 is a top view of a MEMS variable capacitor system having MEMS variable capacitors and feed lines according to an embodiment of the subject matter described herein;

FIG. 12 is a top view of a MEMS variable capacitor system having MEMS variable capacitors and feed lines according to an embodiment of the subject matter described herein;

FIGS. 16A and 16B are a top view and a perspective view, respectively, of a MEMS variable capacitor having a shielding according to an embodiment of the subject matter described herein;

FIG. 16C is a perspective view of a MEMS variable capacitor having a contoured shielding according to an embodiment of the subject matter described herein;

FIGS. 17A-17E are graphs illustrating simulation results of the capacitor system shown in FIG. 5;

FIGS. 18A-18D are graphs illustrating simulation results of the capacitor system shown in FIG. 6;

FIGS. 19A-19E are graphs illustrating simulation results of the capacitor system shown in FIG. 7;

FIG. 20 is a graph illustrating simulation results of the capacitor system shown in FIG. 11;

FIG. 21 is a graph illustrating simulation results of the capacitor system shown in FIG. 15;

FIG. 22 is a graph illustrating simulation results of the capacitor system shown in FIG. 12;

FIGS. 23A and 23B are graphs illustrating simulation results of the capacitor system shown in FIG. 13; and FIG. 24 is a graph illustrating simulation results of the capacitor system shown in FIG. 14.

DETAILED DESCRIPTION

In accordance with the present disclosure, MEMS variable capacitors and actuation components and related methods are provided. The MEMS variable capacitors and actuation components and methods described herein can have particular application for use in MEMS RF devices, systems and methods for a variety of high volume communication applications. The subject matter described herein can be applied for reducing dielectric losses, improving Q, improving capacitance ratio, and improving substrate and circuit isolation.

MEMS Variable Capacitors and Actuation Components

In one embodiment, a MEMS actuation component or variable capacitor can include first and second actuation electrodes being spaced apart, wherein at least one of the actuation electrodes being movable with respect to the other actuation electrode. Further, the MEMS actuation component or variable capacitor can include a movable component attached to the at least one of the actuation electrodes. The movable component can comprise a movable end and a stationary end. The movable end can be movable when a voltage is applied across the first and second actuation electrodes, and wherein the stationary end comprises at least two resilient arms for providing resistance to movement of the movable end when the voltage is applied. One exemplary advantage of the resilient arms is that "snap-in" voltage can be reduced as a result of increased control of resistance to the movement of the movable end when the voltage is applied.

Figure 1A:
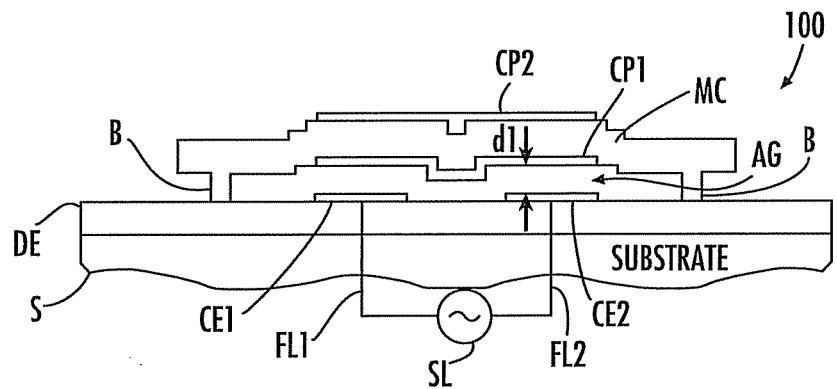
FIGS. 1A-1F are different views of a MEMS variable capacitor according to one embodiment of the subject matter described herein.

FIGS. 1A-1F illustrate different views of a MEMS variable capacitor generally designated 100 according to one embodiment of the subject matter described herein. Alternative to being a variable capacitor, the MEMS variable capacitors shown and described herein can generally be a MEMS actuation component without capacitance functionality. Such MEMS actuation components can be used in any suitable application for effecting movement. FIGS. 1A-2 represent "cantilever-type" variable capacitors. Generally, cantilever-type variable capacitors include a movable component having a single stationary end about which the movable component moves.

FIG. 1A is a cross-sectional front view of variable capacitor 100 in a closed position. Referring to FIG. 1A, variable capacitor 100 can include first and second capacitive elements CE1 and CE2 disposed on a surface of a dielectric layer DE. Capacitive elements CE1 and CE2 can be connected to feed lines FL1 and FL2, respectively. In one example, capacitive elements as described herein can be a feed line extending along the top surface of dielectric layer DE. Alternatively, capacitive elements can be a capacitive plate or any other suitable conductive material shaped and sized for forming capacitance with another nearby conductive material. Feed lines described herein can be between about 10 μm to about 200 μm wide or any other suitable dimension. Further, feed lines described herein can be spaced by about 5 μm to about 50 μm or any other suitable spacing.

Figure 1B:
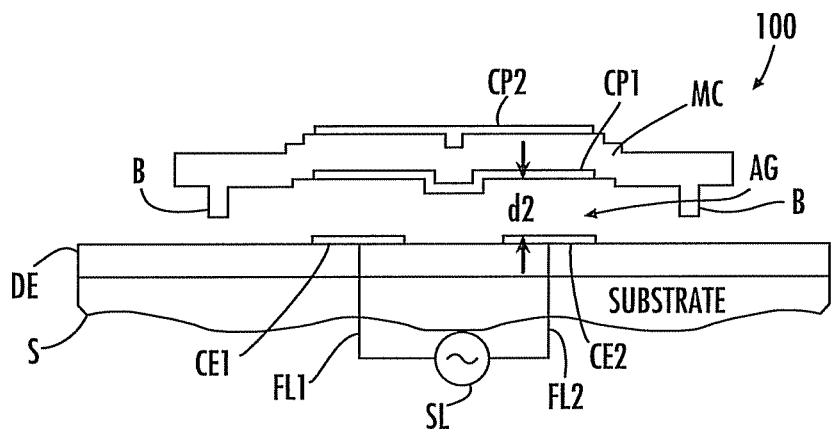

Feed lines FL1 and FL2 can be connected to a signal line SL. A first capacitive plate CP1 can be positioned on an opposing side of an air gap AG from capacitive elements CE1 and CE2 to form a capacitance across feed lines FL1 and FL2. First capacitive plate CP1 can be spaced from capacitive elements CE1 and CE2 by a distance d1 in the closed position. The distance between plate CP1 and capacitive elements CE1 and CE2 can for example be about 0.5 to 4 microns. FIG. 1B is a cross-sectional front view of variable capacitor 100 in an open position, wherein first capacitive plate CP1 can be spaced from capacitive elements CE1 and CE2 by a distance d2. Variable capacitor 100 can include bumps B for preventing capacitive plate CP1 from contacting capacitive elements CE1 and/or CE2. Bumps can be in any number and placed in any suitable positioned on a bottom surface of a movable component for preventing the undesired contact of components. In one example, bumps can be located near capacitive plates. In another example, bumps can be located near actuation electrodes.

Figure 1C:
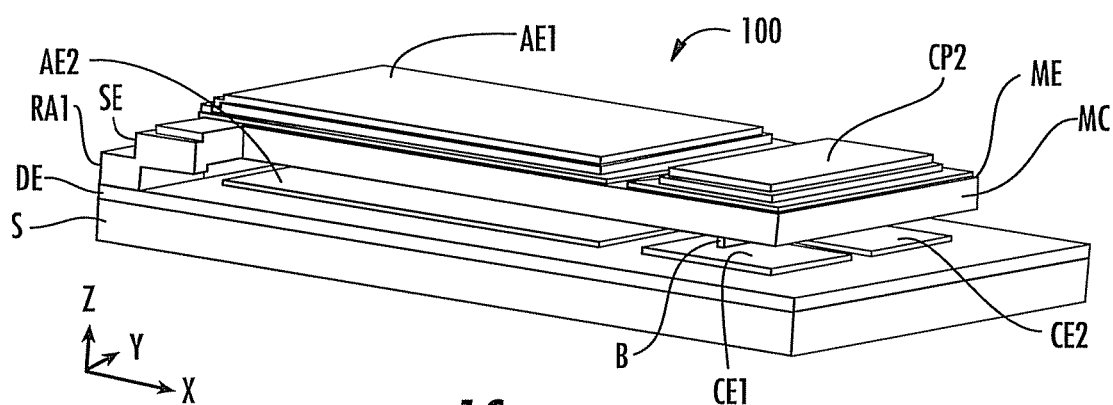

In one embodiment, variable capacitor 100 does not include bumps B as shown in FIGS. 1A-1C. In this embodiment, actuation electrodes AE2 and AE3 can contact. One or both of the contacting surfaces of actuation electrodes AE2 and AE3 can include a dielectric (or other suitable insulator) for preventing the electrical conduction (shorting) between actuation electrodes AE2 and AE3. This can be advantageous, for example, for achieving the largest value capacitors.

FIG. 1C is a top perspective view of variable capacitor 100. Referring to FIG. 1C, the capacitance of variable capacitor 100 can be varied by applying varying voltage across actuation electrodes AE1 and AE2. When voltage is applied across actuation electrodes AE1 and AE2, a movable end ME of a movable component MC can deflect towards substrate S while a stationary end SE remains stationary due to its attachment to dielectric DE and substrate S. As a result of the deflection, the distance between capacitive plates CP1 and CP2 and capacitive elements CE1 and CE2 narrows, and therefore, the capacitance changes. Variable capacitor 100 can also include an actuation electrode (not shown) on an opposing side of movable component MC from actuation electrode AE1 and electrically connected to actuation electrode AE1 for deflecting movable end ME towards substrate S on application of the voltage. This operation will be continuous over a range of actuation voltage and then has a discontinuous jump to a larger capacitance as "pull-in" is achieved. Both modes of operation may be advantageous.

In one embodiment, variable capacitor 100 can be fabricated on a substrate S and dielectric DE. In particular, for example, feed lines FL1 and FL2 can be buried within substrate S and/or dielectric DE and include ends that extend to a surface of dielectric DE. A conductive layer can be deposited over the top surface of dielectric DE and the ends of feed lines FL1 and FL2. The conductive layer can be etched to form capacitive elements CE1 and CE2 on the ends of feed lines FL1 and FL2, respectively. Further, the conductive layer can be etched to form actuation electrodes AE2. Alternatively, actuation electrode AE2 can be formed by lift-off or other patterning processes known by those of skill in the art.

A sacrificial layer can be deposited on capacitive elements CE1 and CE2 and dielectric DE. Next, apertures A1 and A2 can be etched in the sacrificial layer through to the surface of dielectric DE. Movable component MC can be formed by depositing a layer of oxide on capacitive plate CP1, the sacrificial layer, and in apertures A1 and A2 through to the surface of dielectric DE. The sacrificial layer can be removed to form an air gap between capacitive plate CP1 and capacitive elements CE1 and CE2. The air gap can be varied to achieve different capacitances. Further, a conductive layer can be formed on movable component MC and the conductive layer etched to form a second capacitive plate CP2. Exemplary materials for actuation electrodes AE1 and AE2 include metal, semi-metal, doped semiconductor, and combinations thereof. Exemplary materials for movable component MC includes silica, alumina, un-doped semiconductors, polymers, metals, semi-metals, doped semi-conductors, and combinations thereof.

Figure 1D:
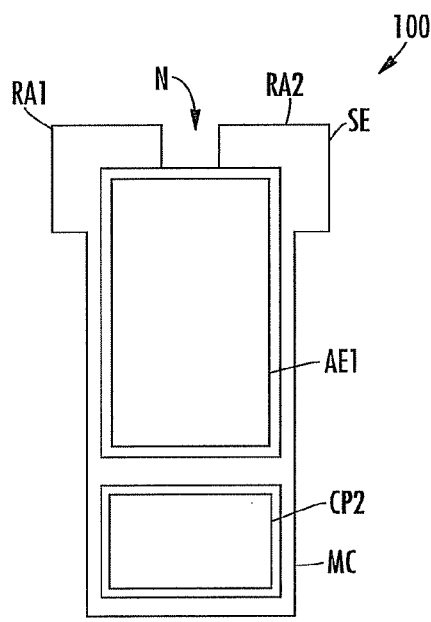

FIG. 1D is a top view of variable capacitor 100. Stationary end SE includes resilient arms RA1 and RA2, which can bend and resist the deflection of movable end ME towards substrate S when voltage is applied across the actuation electrodes. A notched portion N provides spacing between resilient arms RA1 and RA2. The thickness of resilient arms RA1 and RA2 can be varied for increasing or decreasing their resistance to the deflection of movable end ME. Further, the length of resilient arms RA1 and RA2 can be made longer or shorter for increasing or decreasing, respectively, resistance to the deflection of movable end ME. Resilient arms RA1 and RA2 can have at least one of a predefined dimension and size for providing a predetermined resistance to the movement of the movable end such that the movable end is a predetermined distance from substrate S when a predetermined voltage is applied across first and second actuation electrodes AE1 and AE2. In one embodiment, resilient arms RA1 and RA2 are substantially parallel to one another. Further, resilient arms RA1 and RA2 can have at least one of a predefined dimension and size for providing a predetermined resistance to the movement of movable end ME such that capacitive plates CP1 and CP2 are a predetermined distance from capacitive elements CE1 and CE2 when a predetermined voltage is applied across first and second actuation electrodes AE1 and AE2.

Figure 1F:
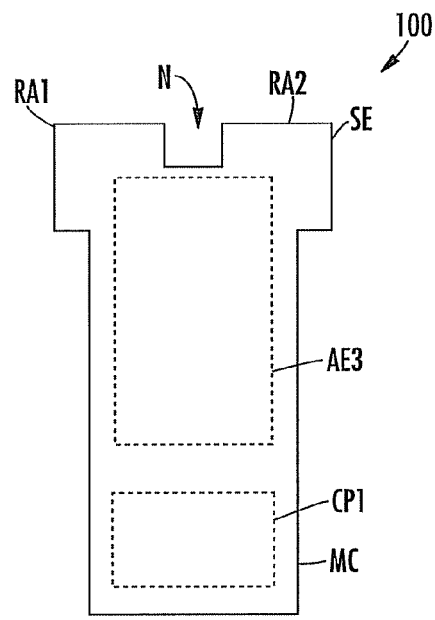
Figure 1E:
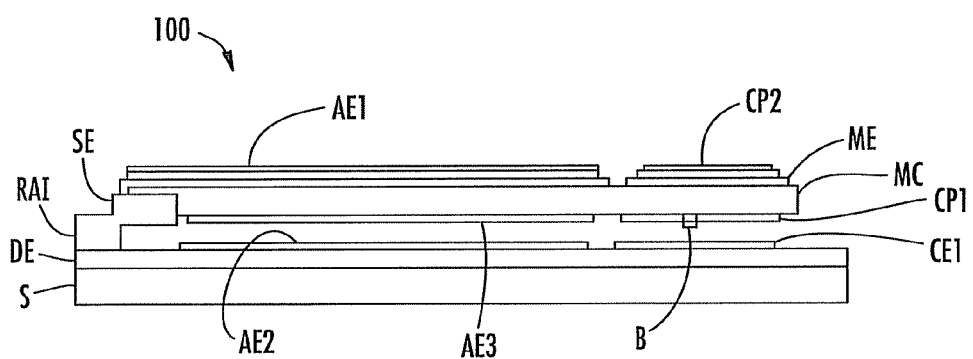

FIG. 1E is a side view of MEMS variable capacitor 100. Variable capacitor 100 can include an actuation electrode AE3 in electrical communication with actuation AE1. A voltage can be applied across second actuation electrode AE2 and first/third actuation electrodes AE1/AE3 for moving movable component MC.

FIG. 1F is another top view of MEMS variable capacitor 100. In this view, actuation electrode AE1 and capacitive plate CP2 are now shown in order to provide a better view of actuation electrode AE3 and capacitive plate CP1 (indicated by broken lines) attached to an underside of movable component MC. Actuation electrode AE3 and capacitive plate CP1 can be electrically connected.

FIG. 2 is a top perspective view of a MEMS variable capacitor generally designated 200 according to one embodiment of the subject matter described herein. Referring to FIG. 2, variable capacitor 200 can be similar to variable capacitor 100 shown in FIG. 1 except for the arrangement of capacitive elements CE1 and CE2 and capacitive plates CP1 and CP2. In particular, capacitive elements CE1 and CE2 can be aligned with one another along the length of movable component. Further, capacitive plates CP1 (not shown) and CP2 can be extended in length such that they are positioned over capacitive elements CE1 and CE2.

In one embodiment, a MEMS variable capacitor or actuation component can include first and second actuation electrodes being spaced apart. At least one of the actuation electrodes can be movable with respect to the other actuation electrode. A movable component can be attached to the first actuation electrode. The movable component can comprise a movable portion and first and second stationary ends. The movable portion can be movable when a voltage is applied across the first and second actuation electrodes. The stationary ends can each comprise at least two resilient arms for providing resistance to movement of the movable component when the voltage is applied.

FIGS. 3A-3C illustrate different views of a MEMS variable capacitor generally designated 300 according to one embodiment of the subject matter described herein. FIGS. 3A and 3B represent "bridge-type" variable capacitors. Generally, bridge-type variable capacitors include a movable component having at least two stationary ends about which a movable portion of the movable component moves.

FIG. 3A is a cross-sectional side view of variable capacitor 300. Referring to FIG. 3A, variable capacitor 300 can include first and second capacitive elements CE1 and CE2 disposed on a surface of a substrate S. Capacitive elements CE1 and CE2 can be connected to feed lines FL1 and FL2, respectively. Feed lines FL1 and FL2 can be connected to signal line SL. First capacitive plate CP1 can be positioned on an opposing side of an air gap AG from capacitive elements CE1 and CE2 to form a capacitance across feed lines FL1 and FL2.

The capacitance of variable capacitor 300 can be varied by applying varying voltage across actuation electrodes. In particular, capacitor 300 can include actuation electrodes AE1, AE2, AE3, and AE4 positioned on movable component. Further, actuation electrodes AE5 and AE6 can be positioned on a top surface of substrate S. A voltage difference can be applied between actuation electrode AE5 and AE1 and AE2. Further, a voltage difference can be applied between actuation electrode AE6 and AE3 and AE4. At a sufficiently high voltage difference, a center portion of a movable component MC (the portion at which capacitive plates CP1 and CP2 are attached) can deflect towards substrate S while stationary ends SE1 and SE2 remain stationary due to their attachment to substrate S. As a result of the deflection, the distance between capacitive plates CP1 and CP2 and capacitive elements CE1 and CE2 narrows, and therefore, the capacitance changes. Pull-in can occur at greater than a threshold voltage such that the capacitor value jumps and becomes stabilized.

In one embodiment, variable capacitor 300 can be fabricated on a substrate S. In particular, for example, feed lines FL1 and FL2 can be buried within substrate S and include ends that extend to a surface of substrate S. A conductive layer can be deposited over the top surface of substrate S and the ends of feed lines FL1 and FL2. The conductive layer can be etched to form capacitive elements CE1 and CE2 on the ends of feed lines FL1 and FL2, respectively. Further, the conductive layer can be etched to form actuation electrodes AE5 and AE6.

A sacrificial layer can be deposited on capacitive elements CE1 and CE2, substrate S, and actuation electrodes AE5 and AE6. Next, apertures can be etched in the sacrificial layer through to the surface of substrate S. Movable component MC can be formed by depositing a layer of oxide on capacitive plates CP1 and CP2, the sacrificial layer, actuation electrode AE5 and AE6, and in the apertures A1 and A2 through to the surface of substrate S. The sacrificial layer can be removed to form an air gap between capacitive plates CP1 and CP2 and capacitive elements CE1 and CE2. The air gap can be varied to achieve different capacitances. Further, a conductive layer can be formed on movable component MC and the conductive layer etched to form a second capacitive plate CP2.

FIG. 3B is a top view of variable capacitor 300. Variable capacitor 300 can include station ends SE1 and SE2. Stationary ends SE1 and SE2 can each include resilient arms RA1 and RA2, which can bend and resist the deflection of movable end ME towards substrate S when voltage is applied across the actuation electrodes. A notched portion N provides spacing between resilient arms RA1 and RA2. The thickness of resilient arms RA1 and RA2 can be varied for increasing or decreasing their resistance to the deflection of movable end ME. Further, the length of resilient arms RA1 and RA2 can be made longer or shorter for increasing or decreasing, respectively, resistance to the deflection of movable end ME. Resilient arms RA1 and RA1 can have at least one of a predefined dimension and size for providing a predetermined resistance to the movement of a movable portion MP such that capacitive plates CP1 and CP2 are a predetermined distance from capacitive elements CE1 and CE2 when a predetermined voltage is applied across the actuation electrodes. FIG. 3C is a perspective view of MEMS variable capacitor 300.

In one embodiment, a plurality of MEMS variable capacitors as described above can be spaced apart from substantially parallel feed lines for varying capacitance between the feed lines over a predetermined capacitance range. This arrangement can result in a reduction in substrate surface area required for implementing the variable capacitor. In particular, a MEMS variable capacitor according to the subject matter described herein can include first and second feed lines extending substantially parallel to one another. Further, the MEMS variable capacitor can include first and second capacitive plates being spaced apart from the first and second feed lines. The first and second capacitive plate can be separately movable with respect to at least one of the first and second feed lines for varying the capacitance between the first and second feed lines over a predetermined capacitance range.

MEMS Variable Capacitors and Variable Capacitor Systems

In one embodiment, a MEMS variable capacitor can include first and second feed lines extending substantially parallel to one another. The variable capacitor can also include first and second capacitive plates spaced apart from the first and second feed lines. The first and second capacitive plates can be separately movable with respect to at least one of the first and second feed lines for varying the capacitance between the first and second feed lines over a predetermined capacitance range.

It can be advantageous to include a maximum number of capacitive elements while minimizing the length of its feed network in order to reduce feed resistance and maximize Q for a given capacitance. It is also advantageous to achieve a desired capacitance range with a given number of MEMS variable capacitance while minimizing the number/amount of feed lines and feed pads required to achieve the desired capacitance range to maximize area usage and minimize parasitic capacitance. This is one exemplary objective of the examples provided hereinbelow.

Figure 4:
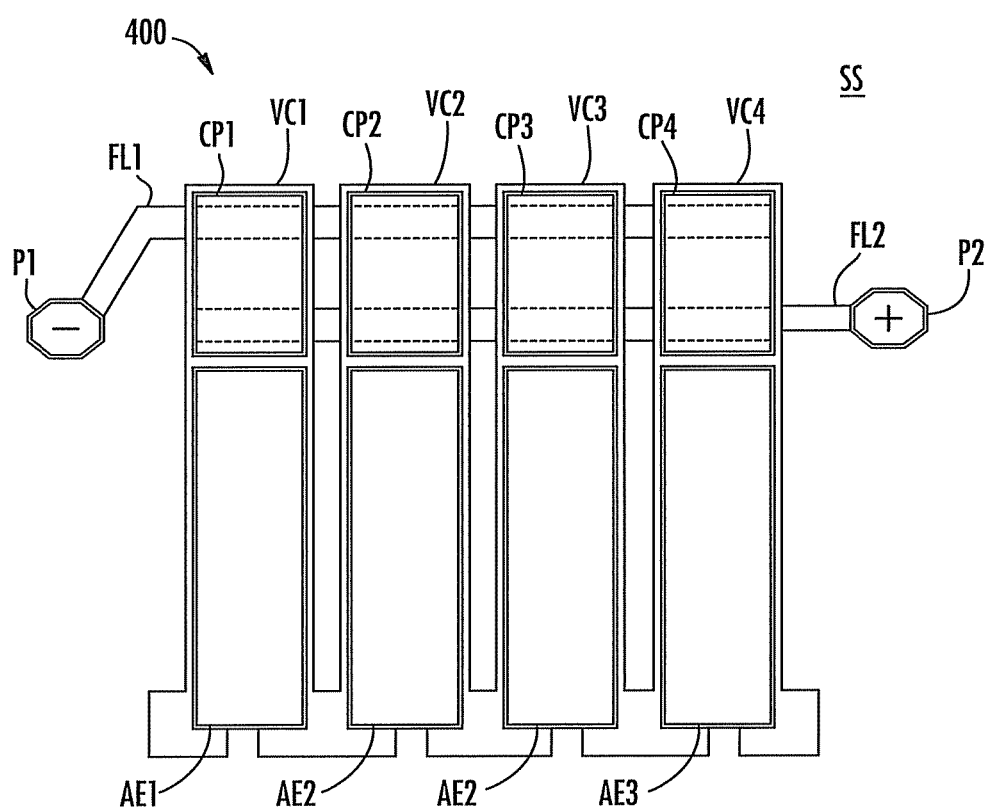
FIG. 4 is a top view of a MEMS variable capacitor having feed lines extending substantially parallel to one another according to an embodiment of the subject matter described herein.

FIG. 4 is a top view of MEMS variable capacitor generally designated 400 having feed lines extending substantially parallel to one another according to an embodiment of the subject matter described herein. Referring to FIG. 4, variable capacitor 400 can include feed lines FL1 and FL2 extending substantially parallel to one another. In this example, feed lines FL1 and FL2 are attached to pads P1 and P2, respectively, on a top surface of substrate SS. Feed lines FL1 and FL2 can be positioned on substrate surface SS or can be in in whole or in part buried beneath substrate surface SS. Feed pads P1 and P2 can be connected to a signal line.

Variable capacitor 400 can include a plurality of capacitive plates CP1, CP2, CP3, and CP4 spaced apart from feed lines FL1 and FL2 in an at least substantially perpendicular direction with respect to substrate surface SS. Capacitive plates CP1, CP2, CP3, and CP4 can be separately movable with respect to at least one of feed lines FL1 and FL2 for varying the capacitance between feed lines FL1 and FL2 over a predetermined capacitance range. In particular, capacitive plates CP1, CP2, CP3, and CP4 can be separately movable in a substantially vertical direction with respect to substrate surface SS by actuation of variable capacitors VC1, VC2, VC3, and VC4, respectively.

In FIG. 4, there are four variable capacitors VC1, VC2, VC3, and VC4. Alternatively, there can be any suitable number of variable capacitors across feed lines FL1 and FL2 (e.g., 1 or 2 variables capacitors). The feed line length can be reduced or lengthened depending on the variable capacitor size in order to minimize the area required by all of the components.

Variable capacitors VC1, VC2, VC3, and VC4 can be similar to actuation component 200 shown in FIG. 2. In particular, variable capacitors VC1, VC2, VC3, and VC4 can include actuation electrodes AE1, AE2, AE3, and AE4, respectively, and corresponding actuation electrodes attached to substrate surface SS. Movement of variable capacitors VC1, VC2, VC3, and VC4 can be effected by application of a voltage across actuation electrodes AE1, AE2, AE3, and AE4, respectively, and a corresponding actuation electrode attached to substrate surface SS. By controlling the movement of variable capacitors VC1, VC2, VC3, and VC4, capacitive plates CP1, CP2, CP3, and CP4 can be separately movable with respect to at least one of feed lines FL1 and FL2 for varying the capacitance between feed lines FL1 and FL2 over a predetermined capacitance range.

In one embodiment, variable capacitors VC1, VC2, VC3, and VC4 can each be substituted with variable capacitor 300 shown in FIG. 3. In this embodiment, variable capacitor 300 can form a "bridge" over feed lines FL1 and FL2 such that capacitive plates CP1 and CP2 are positioned over feed lines FL1 and FL2. By controlling the movement of the variable capacitors, capacitive plates CP1 and CP2 can be moved with respect to feed lines FL1 and FL2 for varying the capacitance between feed lines FL1 and FL2 over a predetermined capacitance range.

In one embodiment, a MEMS variable capacitor system can include variable capacitors as described above connected to alternating feed pads. This arrangement can result in a reduction in substrate surface area required for implementing the variable capacitor. A MEMS variable capacitor system according to an embodiment of the subject matter described herein can include first, second, and third feed pads being spaced apart. In one example, the feed pads can be aligned along a substrate surface in a substantially straight line. Further, MEMS variable capacitors and feed lines can be positioned between the feed pads.

The first feed line can be connected to a first feed pad and extend towards a second feed pad. A second feed line can be connected to the second feed pad and extend towards the second feed pad. Third and fourth feed lines can be connected to the third feed pad and extend towards the first and second feed pads, respectively. A first capacitive plate can be spaced apart from the first and third feed lines. The first capacitive plate can be movable with respect to at least one of the first and third feed lines for varying the capacitance between the first and third feed lines over a predetermined capacitance range. A second capacitive plate can be spaced apart from the second and fourth feed lines. The second capacitive plate can be movable with respect to at least one of the second and fourth feed lines for varying the capacitance between the second and fourth feed lines over a second predetermined capacitance range. In one example, a MEMS variable capacitor as described herein can be connected to a capacitive plate for moving the capacitive plate with respect to at least one feed line.

In one embodiment, a MEMS variable capacitor system can include first, second, and third feed pads being spaced apart. A first feed line can be connected to the first feed pad and extending towards the third feed pad. A second feed line can be connected to the second feed pad and extending towards the third feed pad. Third and fourth feed lines connected to the third feed pad and extending towards the first and second feed pads, respectively. A first capacitive plate can be spaced apart from the first and third feed lines. The first capacitive plate can be movable with respect to at least one of the first and third feed lines for varying the capacitance between the first and third feed lines over a first predetermined capacitance range. A second capacitive plate can be spaced apart from the second and fourth feed lines. The second capacitive plate can be movable with respect to at least one of the second and fourth feed lines for varying the capacitance between the second and fourth feed lines over a second predetermined capacitance range.

Figure 5:
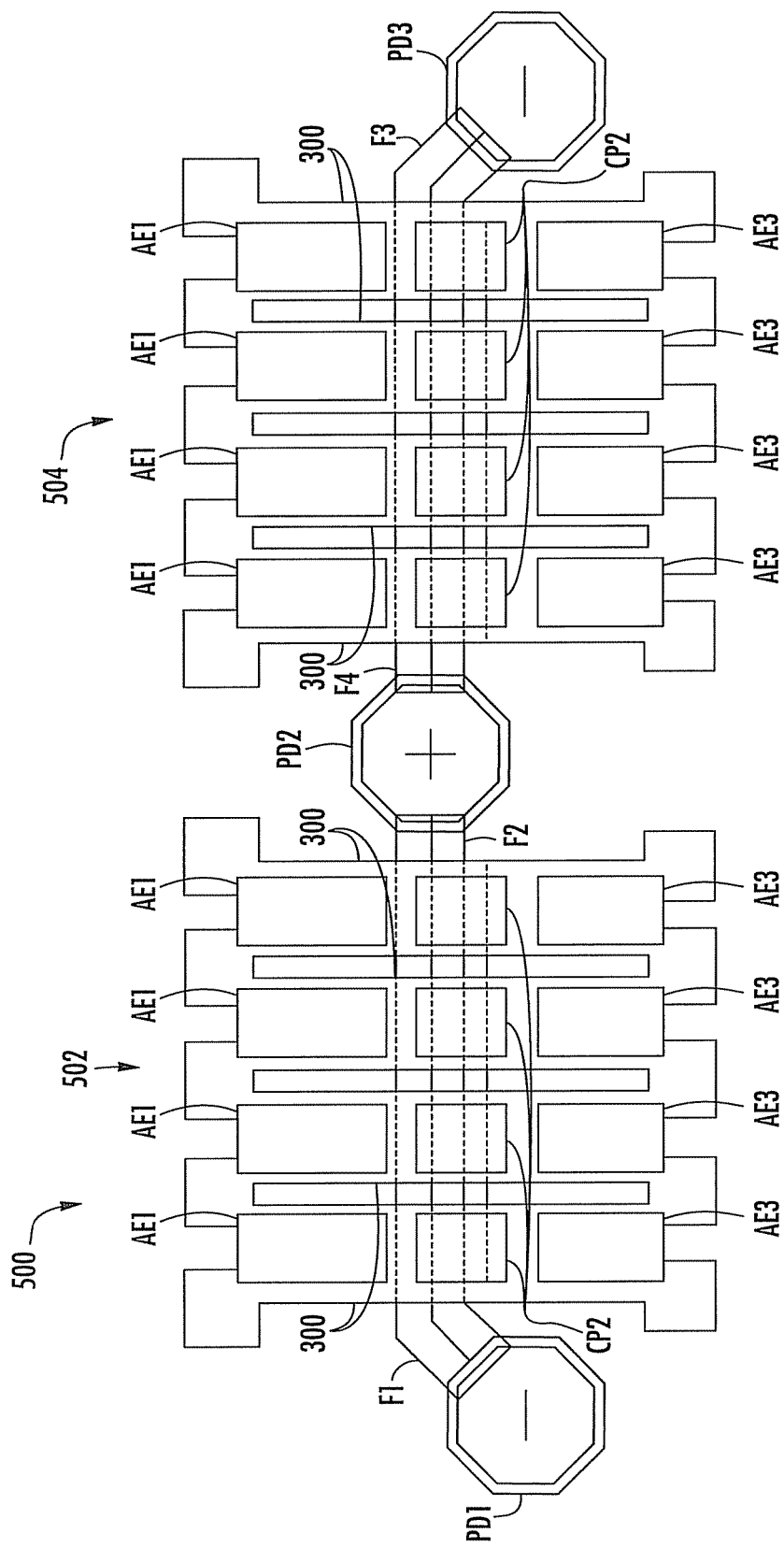
FIG. 5 is a top view of a MEMS variable capacitor system having MEMS variable capacitors and feed lines connected to alternating feed pads according to an embodiment of the subject matter described herein.

FIG. 5 is a top view of a MEMS variable capacitor system generally designated 500 having MEMS variable capacitors and feed lines connected to alternating feed pads according to an embodiment of the subject matter described herein. Referring to FIG. 5, system 500 can include variable capacitors 502 and 504 where each can include a plurality of variable capacitors 300. Variable capacitors 300 can each include actuation electrodes AE1 and AE2. Voltage can be applied across actuation electrodes AE1 and AE2 and respective variable capacitors attached to substrate surface SS for movement of variable capacitors 300 with respect to substrate surface SS.

Capacitive plates CP2 of capacitor 500 can be spaced apart from feed lines F1 and F2. On application of voltage for movement of variable capacitors 300, capacitive plates CP2 of capacitor 500 can move with respect to at least one of feed lines F1 and F2 for varying the capacitance between feed lines FL1 and FL2 over a predetermined capacitance range. Similarly, voltage can be applied to variable capacitors 300 of capacitor 502 for varying the capacitance between feed lines FL3 and FL4 positioned below capacitive plates CP2.

System 500 can include feed pads PD1, PD2, and PD3 that are spaced apart and connected to signal lines. In particular, feed pads PD1 and PD2 can be connected to a signal line. Feed pads PD2 and PD3 can be connected to another signal line. Feed line F1 can be connected to feed pad PD1 and extend towards feed pad PD2. Feed line F3 can be connected to feed pad PD3 and extend towards feed pad PD2. Feed lines F2 and F4 can be connected to feed pad PD2 and extend towards feed pads PD1 and PD3, respectively. Feed lines F1 and F2 can be substantially parallel to one another. Feed lines F3 and F4 can be substantially parallel to one another. The variable capacitors can be individually controlled for selectively varying the capacitance.

In one embodiment, variable capacitors 300 can each be substituted with variable capacitor 200 shown in FIG. 2. In this embodiment, capacitance plate CP2 of variable capacitor 100 can be positioned over the feed lines. By controlling the movement of the variable capacitors, capacitive plate CP2 can be moved with respect to respective feed lines for varying the capacitance between the feed lines over a predetermined capacitance range. The variable capacitors can be individually controlled for selectively varying the capacitance.

Individual element capacitance can vary between 1 fF and 10 pF with arrays used to build up larger total capacitance values. The values of capacitance elements in an array may not all be the same. For example, the capacitor head cross a pair of feed lines can have different widths. Scaling the actuator properly with the capacitor can yield the same actuation voltage but the different capacitor head width can provide a different capacitance. For example, it may be advantageous to have a binary sequence of capacitance values where the capacitor head widths vary proportional to powers of 2. The capacitor electrodes can have dimensions in either direction from 1 micron to 200 microns. The electrodes can be made from a highly conductive material such as a metal or semi-metal. The feed line widths can be sized in combination with the capacitor electrode to determine the capacitance and may be between 5 microns and 200 microns. The feedline length is set the minimum required to feed all the capacitors in the array. As more elements are added to a given array fed by a set of pads, the Q will be reduced. At the other extreme of one MEMS capacitor per pad, pad parasitics will limit the performance. Thus, there is an optimum number of MEMS elements per set of pads that is design specific but will typically range from 2 to 8. Note that more elements can be added by paralleling multiple arrays as is shown in the several of the figures. This paralleling can also be done the circuit to which the capacitor array is connected. The operation voltage of the actuators is between 3 and 150V with values near 40V preferable due to the balance of actuator area usage and voltage capabilities of readily available commercial CMOS control circuitry.

Figure 6A:
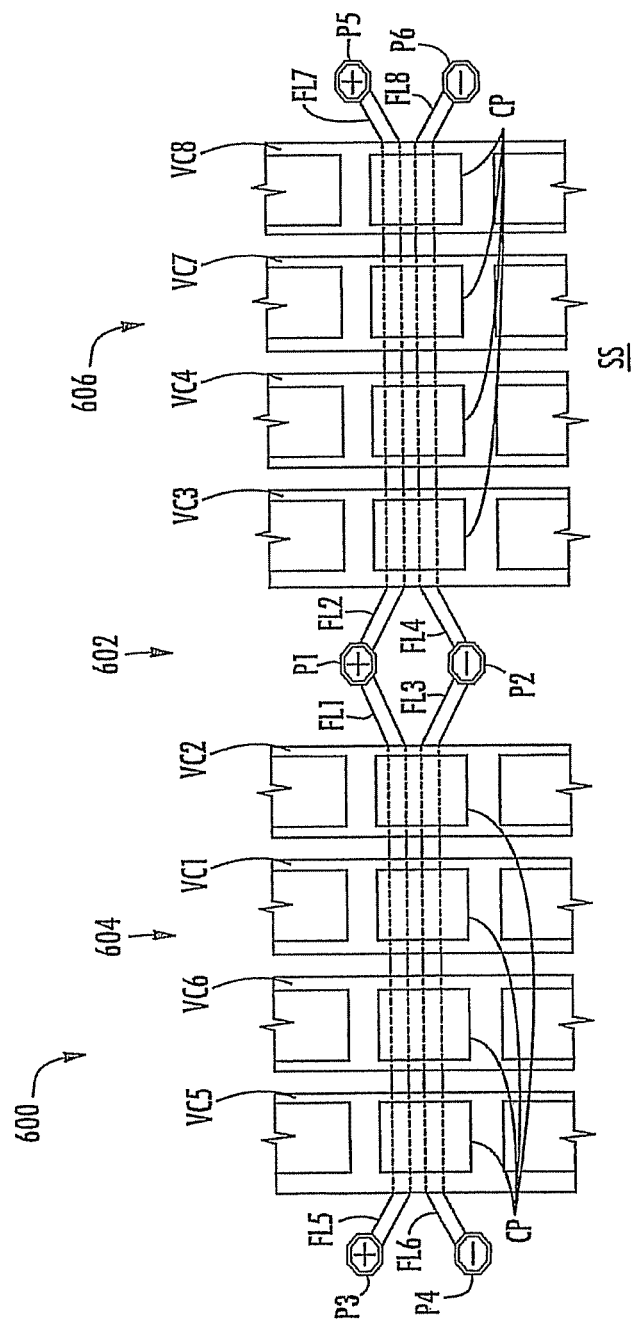
FIG. 6A is a top view of a MEMS variable capacitor system having MEMS variable capacitors and feed lines according to an embodiment of the subject matter described herein.

FIG. 6A is a top view of a MEMS variable capacitor system generally designated 600 having MEMS variable capacitors and feed lines according to an embodiment of the subject matter described herein. Referring to FIG. 6A, system 600 can include variable capacitors generally designated 602, 604, and 606. Variable capacitor 602 can include variable capacitors VC1, VC2, VC3, and VC4 positioned above feed lines FL1, FL2, FL3, and FL4. In particular, capacitive plates CP of variable capacitors VC1 and VC2 can be disposed over feed lines FL1 and FL3. Further, capacitive plates CP of variable capacitors VC3 and VC4 can be disposed over feed lines FL2 and FL4. The capacitive plates can be spaced apart from the feed lines in an at least substantially perpendicular direction with respect to substrate surface SS. Feed lines FL1 and FL2 can be connected to feed pad P1. Feed lines FL3 and FL4 can be connected to feed pad P2. Feed pads P1 and P2 can be connected to a signal line. The capacitive plates can be separately moved by application of voltages to variable capacitors for movement of the variable capacitors such that the capacitances between feed lines FL1 and FL3 and feed lines FL2 and FL4 are selectively varied.

Variable capacitor 604 can include variable capacitors VC5 and VC6 having capacitive plates CP positioned above feed lines FL5 and FL6. Capacitive plates CP of variable capacitors VC5 and VC6 can be separately moved by application of voltages to variable capacitors VC5 and VC6 for movement of components VC5 and VC6 such that the capacitance between feed lines FL5 and FL6 is selectively varied. Feed lines FL5 and FL6 can be connected to feed pads P3 and P4, respectively. Feed pads P3 and P4 can be connected to a signal line.

Variable capacitor 606 can include variable capacitors VC7 and VC8 having capacitive plates CP positioned above feed lines FL7 and FL8. Capacitive plates CP of variable capacitors VC7 and VC8 can be separately moved by application of voltages to variable capacitors VC7 and VC8 for movement of components VC7 and VC8 such that the capacitance between feed lines FL7 and FL8 is selectively varied. Feed lines FL7 and FL8 can be connected to feed pads P5 and P6, respectively. Feed pads P5 and P6 can be connected to a signal line.

As set forth above, it can be advantageous to include a maximum number of capacitive elements as compared to the length of its feed network in order to maximize Q for a given capacitance. In an example of modifying the embodiment described with respect to FIG. 6A for providing a "2 bit" variable capacitor, a variable capacitor may only include variable capacitors VC2 and VC3, feedlines FL1-FL4 extending only under variable capacitors VC2 and VC3 to an outer edge of the variable capacitors, and feed pads P1 and P2. Variable capacitors VC2 and VC3 can be controllably activated for providing a "2 bit" variable capacitor. In this example, a maximum number of capacitive elements (i.e., 2) is provided as compared to its feed network in order to maximize Q for a given capacitance range.

Figure 6B:
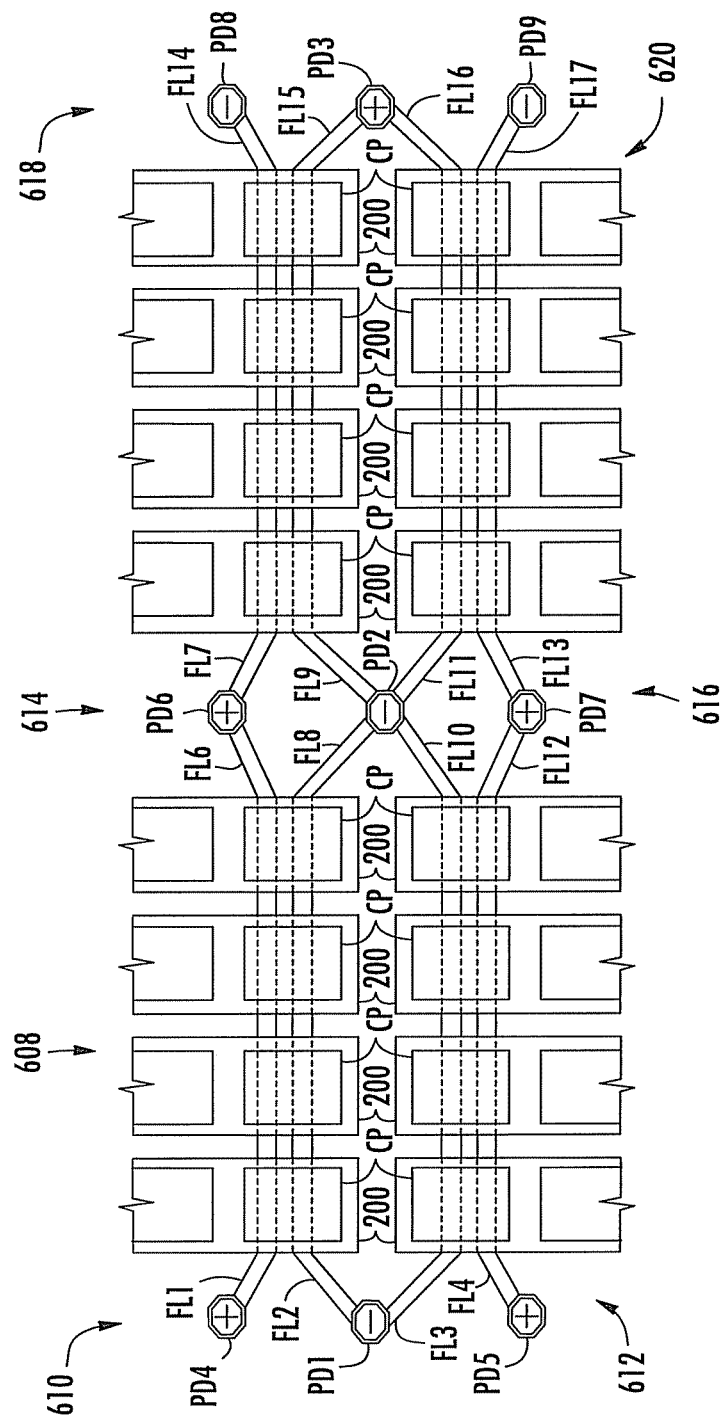
FIG. 6B is a top view of a MEMS variable capacitor system having double sets of cantilever-type variable capacitors and feed lines according to an embodiment of the subject matter described herein.

In this example, the variable capacitors are "bridge" variable capacitors as shown in FIGS. 3A and 3B. Alternatively, the variable capacitors can be "cantilever-type" variable capacitors as shown in FIG. 2. FIG. 6B is a top view of a MEMS variable capacitor system generally designated 608 having double sets of cantilever-type variable capacitors and feed lines according to an embodiment of the subject matter described herein. Referring to FIG. 6B, system 608 can include a plurality of variable capacitors generally designated 610, 612, 614, 616, 618, and 620 having a plurality of cantilever-type variable capacitors 200. Variable capacitors 200 can include capacitive plates CP. Variable capacitors 610 and 612 share a common feed pad PD1. Variable capacitors 614 and 616 share a common feed pad PD2. Variable capacitors 618 and 620 can share a common feed pad PD3.

Variable capacitors 200 of variable capacitor 610 can be positioned over feed lines FL1 and FL2. Feed line FL1 can be connected to a feed pad PD4. Feed pads PD1 and PD4 can be connected to a signal line. variable capacitors 200 of capacitors 610 can be separately activated for varying the capacitance between feeds lines FL1 and FL2.

Variable capacitors 200 of variable capacitor 612 can be positioned over feed lines FL3 and FL4. Feed lines FL3 and FL4 can be connected to feed pads PD1 and PD5, respectively. Feed pads PD1 and PD5 can be connected to a signal line. Variable capacitors 200 of capacitors 612 can be separately activated for varying the capacitance between feeds lines FL3 and FL4.

Variable capacitors 200 of variable capacitor 614 can be positioned over feed lines FL6, FL7, FL8, and FL9. Feed lines FL6 and FL7 can be connected to a feed pad PD6. Feed lines FL8 and FL9 can be connected to a feed pad PD2. Feed pads PD2 and PD6 can be connected to a signal line. Variable capacitors 200 of capacitors 614 can be separately activated for varying the capacitance between feeds lines FL6/FL7 and FL8/FL9.

Variable capacitors 200 of variable capacitor 616 can be positioned over feed lines FL10, FL11, FL12, and FL13. Feed lines FL10 and FL11 can be connected to a feed pad PD2. Feed lines FL12 and FL13 can be connected to a feed pad PD7. Feed pads PD2 and PD7 can be connected to a signal line. Variable capacitors 200 of capacitors 616 can be separately activated for varying the capacitance between feeds lines FL10/FL11 and FL12/FL13.

Variable capacitors 200 of variable capacitor 618 can be positioned over feed lines FL14 and FL15. Feed line FL14 can be connected to a feed pad PD8. Feed line FL15 is connected to feed pad PD3. Feed pads PD3 and PD8 can be connected to a signal line. Variable capacitors 200 of capacitors 618 can be separately activated for varying the capacitance between feeds lines FL14 and FL15.

Variable capacitors 200 of variable capacitor 620 can be positioned over feed lines FL16 and FL17. Feed line FL16 can be connected to feed pad PD3. Feed line FL17 can be connected to a feed pad PD9. Feed pads PD3 and PD9 can be connected to a signal line. Variable capacitors 200 of capacitors 620 can be separately activated for varying the capacitance between feeds lines FL16 and FL17.

Figure 6C:
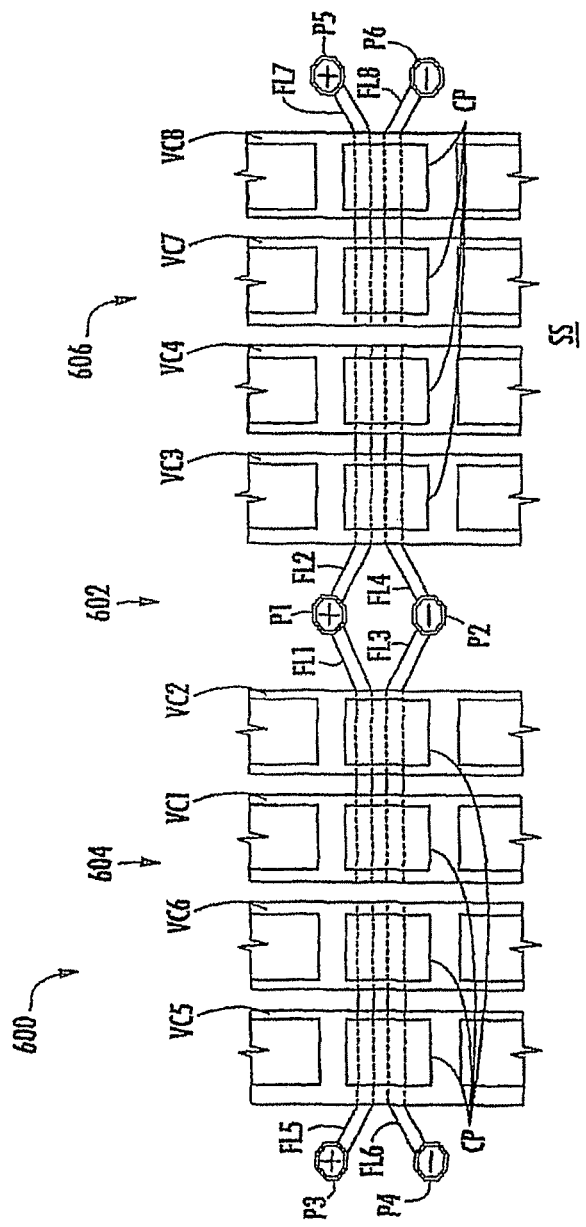
FIG. 6C is a top view of another MEMS variable capacitor system having double sets of cantilever-type variable capacitors and feed lines according to an embodiment of the subject matter described herein.

FIG. 6C is a top view of another MEMS variable capacitor system having double sets of cantilever-type variable capacitors and feed lines according to an embodiment of the subject matter described herein. This system is similar to the system shown in FIG. 6A except the feed lines are not connected between variable capacitors VC1 and VC6 as shown. Further, the feed lines are not connected between variable capacitors VC4 and VC7 as shown. In this example, the variable capacitors positioned above respective feed lines can function together as a single capacitor for effecting capacitance change at respective feed pads. Additionally, shielding material (as described below with respect to the examples of FIGS. 16A-16C) can be provided in a substrate beneath these components for providing the functionality described hereinbelow with respect to shielding.

In one embodiment, a MEMS variable capacitor system can include a common feed line being surrounded by a plurality of other feed lines for varying the capacitance between the common feed line with respect to the other feed lines. In particular a MEMS variable capacitor according to one embodiment of the subject matter described herein can include a first feed line between positioned on a first defined area. A plurality of second feed lines can be positioned on a plurality of second defined areas that can at least substantially surround the first defined area. A plurality of capacitive plates can each be spaced apart from the first feed line. Further, each of the capacitive plates can be spaced apart from a respective one of the second feed lines. Each of the capacitive plates can be separately movable with respect to the first feed line and the respective one of the second feed lines for varying the capacitance between the first feed line and the respective one of the second feed lines over a predetermined capacitance range.

In one embodiment, a MEMS variable capacitor can include a first feed line being positioned on a first defined area. A plurality of second feed lines can be positioned on a plurality of second defined areas that substantially surround the first defined area. A plurality of capacitive plates can each be spaced apart from the first feed line. Further, each of the capacitive plates can be spaced apart from a respective one of the second feed lines. Each of the capacitive plates can be separately movable with respect to the first feed line and the respective one of the second feed lines for varying the capacitance between the first feed line and the respective one of the second feed lines over a predetermined capacitance range.

Figure 7:
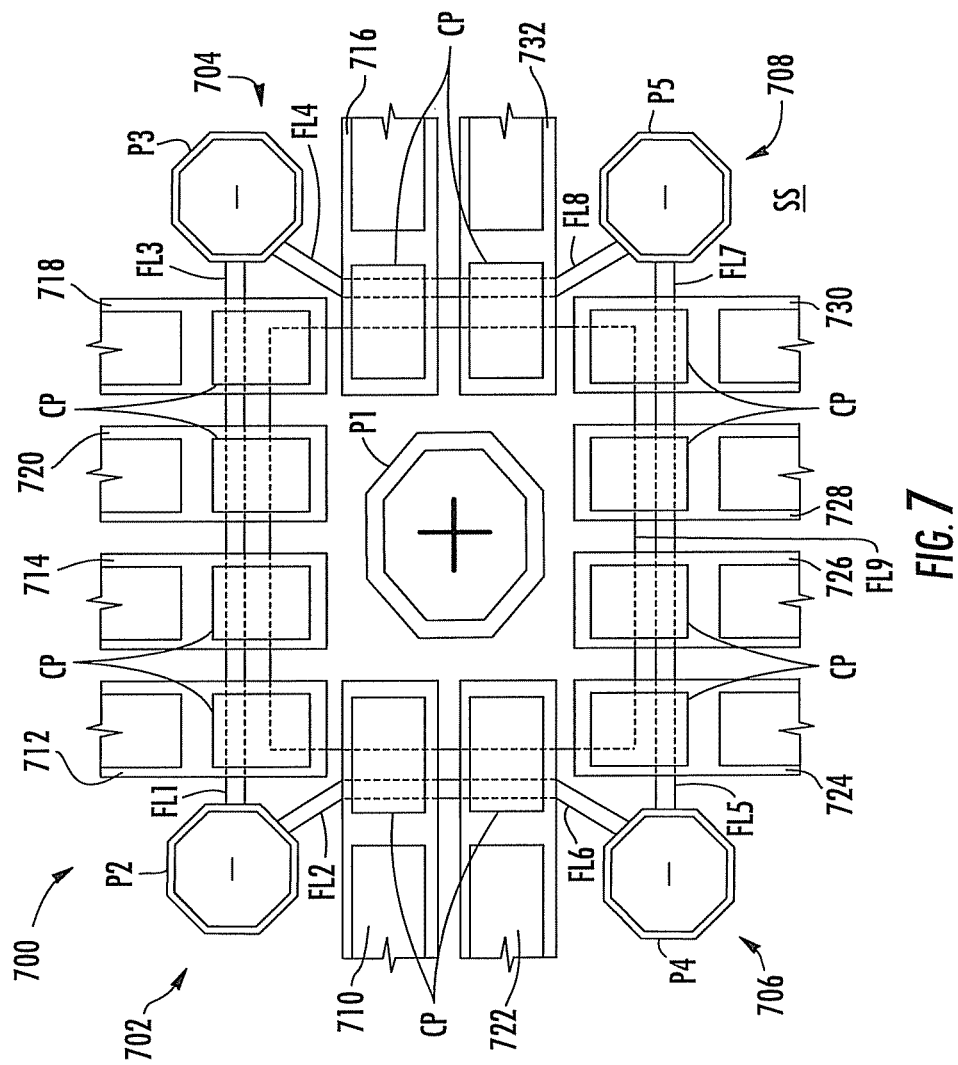
FIG. 7 is a top view of a MEMS variable capacitor system having MEMS variable capacitors and feed lines according to an embodiment of the subject matter described herein.

FIG. 7 is a top view of a MEMS variable capacitor system generally designated 700 having MEMS variable capacitors and feed lines according to an embodiment of the subject matter described herein. Referring to FIG. 7, system 700 can include variable capacitors generally designated 702, 704, 706, and 708. Variable capacitor system 700 can include cantilever-type variable capacitors 710-732 positioned overfeed lines FL1-FL9. In particular, capacitive capacitive plate CP of variable capacitors 710 is positioned overfeed lines FL2 and FL9. Capacitive plate CP of variable capacitors 712 and 714 are positioned over feed lines FL1 and FL9. The capacitive plates can be spaced apart from the feed lines in an at least substantially perpendicular direction with respect to substrate surface SS. Feed line FL9 can be connected to feed pad P1. Feed lines FL1 and FL2 can be connected to feed pad P2. Feed pads P1 and P2 can be connected to a signal line. The capacitive plates can be separately moved by application of voltages to variable capacitors 710, 712, and 714 for movement of the variable capacitors such that the capacitances between feed lines FL1 and FL9 and feed lines FL2 and FL9 are selectively varied.

Variable capacitor 704 can include variable capacitors 716, 718, and 720 having capacitive plates CP positioned above feed lines FL3, FL4 and FL9. Capacitive plates CP of variable capacitor 716, 718, and 720 can be separately moved by application of voltages to variable capacitors 716, 718, and 720 for movement of components 716, 718, and 720 such that the capacitances between feed line FL9 and feed lines FL3 and FL4 are selectively varied. Feed lines FL3 and FL4 can be connected to feed pad P3. Feed pads P1 and P3 can be connected to a signal line.

Variable capacitor 706 can include variable capacitors 722, 724, and 726 having capacitive plates CP positioned above feed lines FL5, FL6 and FL9. Capacitive plates CP of variable capacitors 722, 724, and 726 can be separately moved by application of voltages to variable capacitors 722, 724, and 726 for movement of components 722, 724, and 726 such that the capacitances between feed line FL9 and feed lines FL5 and FL6 are selectively varied. Feed lines FL5 and FL6 can be connected to feed pad P4. Feed pads P1 and P4 can be connected to a signal line.

Variable capacitor 708 can include variable capacitors 728, 730, and 732 having capacitive plates CP positioned above feed lines FL7, FL8 and FL9. Capacitive plates CP of variable capacitors 728, 730, and 732 can be separately moved by application of voltages to variable capacitors 728, 730, and 732 for movement of components 728, 730, and 732 such that the capacitances between feed line FL9 and feed lines FL7 and FL8 are selectively varied. Feed lines FL7 and FL8 can be connected to feed pad P5. Feed pads P1 and P5 can be connected to a signal line.

In the example of system 700, feed line FL9 is positioned on a defined area of substrate surface SS. Feed lines FL1-FL8 are positioned on a plurality of other defined areas of substrate surface SS. The defined areas of feed lines FL1-FL8 can at least substantially surround the defined area of feed line FL9. As set forth above, capacitor plates CP are spaced apart from feed lines FL1-FL9. Capacitor plates CP are separately movable with respect to the feed lines for varying the capacitance between feed line FL9 and the other feed lines, as described above, over a predetermined capacitance range.

Figure 8A:
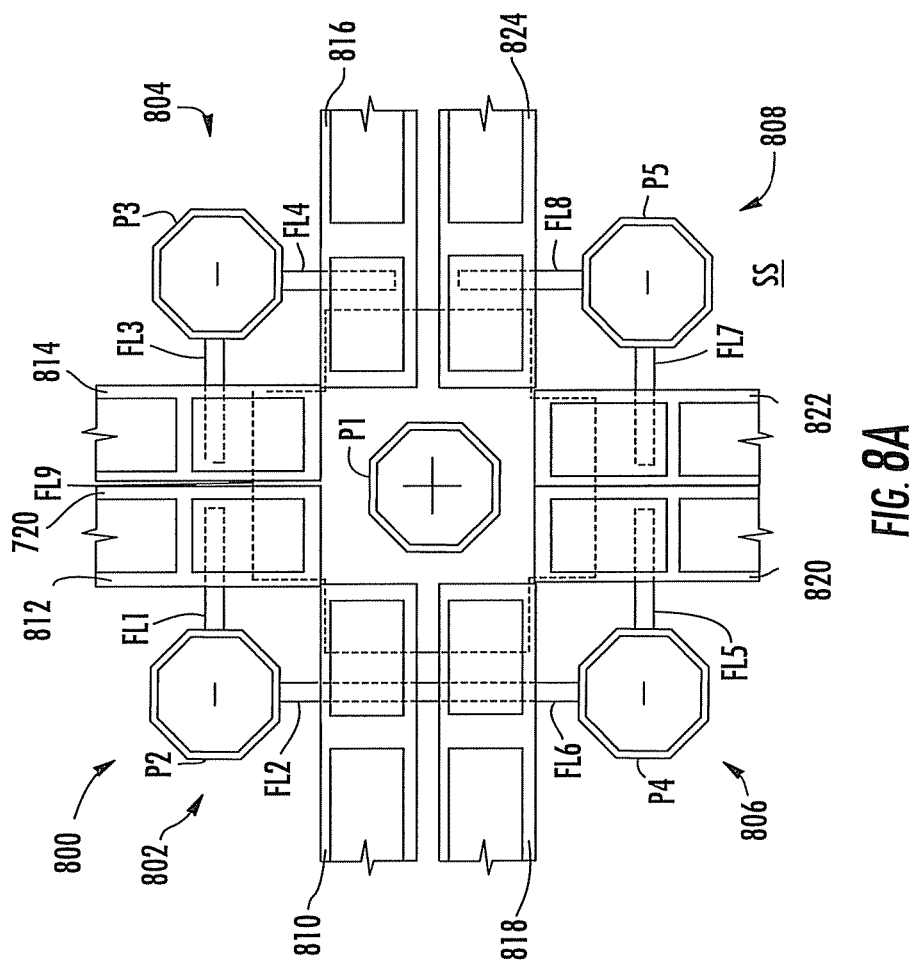
FIG. 8A is a top view of a MEMS variable capacitor system having MEMS variable capacitors and feed lines according to an embodiment of the subject matter described herein.

FIG. 8A is a top view of a MEMS variable capacitor system generally designated 800 having MEMS variable capacitors and feed lines according to an embodiment of the subject matter described herein. Referring to FIG. 8A, system 800 can include variable capacitors generally designated 802, 804, 806, and 808. System 800 can include cantilever-type variable capacitors 810-824 positioned over feed lines FL1-FL9. In particular, capacitive plate CP of variable capacitor 810 is positioned over feed lines FL2 and FL9. Capacitive plate CP of variable capacitor 812 is positioned over feed lines FL1 and FL9. The capacitive plates can be spaced apart from the feed lines in an at least substantially perpendicular direction with respect to substrate surface SS. Feed line FL9 can be connected to feed pad P1. Feed lines FL1 and FL2 can be connected to feed pad P2. Feed pads P1 and P2 can be connected to a signal line. The capacitive plates can be separately moved by application of voltages to variable capacitors 810 and 812 for movement of the variable capacitors such that the capacitances between feed lines FL1 and FL9 and feed lines FL2 and FL9 are selectively varied.

Variable capacitor 804 can include variable capacitors 814 and 816 having capacitive plates CP positioned above feed lines FL3, FL4 and FL9. Capacitive plates CP of variable capacitors 814 and 816 can be separately moved by application of voltages to variable capacitors 814 and 816 for movement of components 814 and 816 such that the capacitances between feed line FL9 and feed lines FL3 and FL4 are selectively varied. Feed lines FL3 and FL4 can be connected to feed pad P3. Feed pads P1 and P3 can be connected to a signal line.

Variable capacitor 806 can include variable capacitors 818 and 820 having capacitive plates CP positioned above feed lines FL5, FL6 and FL9. Capacitive plates CP of variable capacitors 818 and 820 can be separately moved by application of voltages to variable capacitors 818 and 820 for movement of components 818 and 820 such that the capacitances between feed line FL9 and feed lines FL5 and FL6 are selectively varied. Feed lines FL5 and FL6 can be connected to feed pad P4. Feed pads P1 and P4 can be connected to a signal line.

Variable capacitor 808 can include variable capacitors 822 and 824 having capacitive plates CP positioned above feed lines FL7, FL8 and FL9. Capacitive plates CP of variable capacitors 822 and 824 can be separately moved by application of voltages to variable capacitors 822 and 824 for movement of components 822 and 824 such that the capacitances between feed line FL9 and feed lines FL7 and FL8 are selectively varied. Feed lines FL7 and FL8 can be connected to feed pad P5. Feed pads P1 and P5 can be connected to a signal line.

In the example of system 800, feed line FL9 is positioned on a defined area of substrate surface SS. Feed lines FL1-FL8 are positioned on a plurality of other defined areas of substrate surface SS. The defined areas of feed lines FL1-FL8 substantially surround the defined area of feed line FL9. As set forth above, capacitor plates CP can be spaced apart from feed lines FL1-FL9. Capacitor plates CP are separately movable with respect to the feed lines for varying the capacitance between feed line FL9 and the other feed lines, as described above, over a predetermined capacitance range.

Figure 8B:
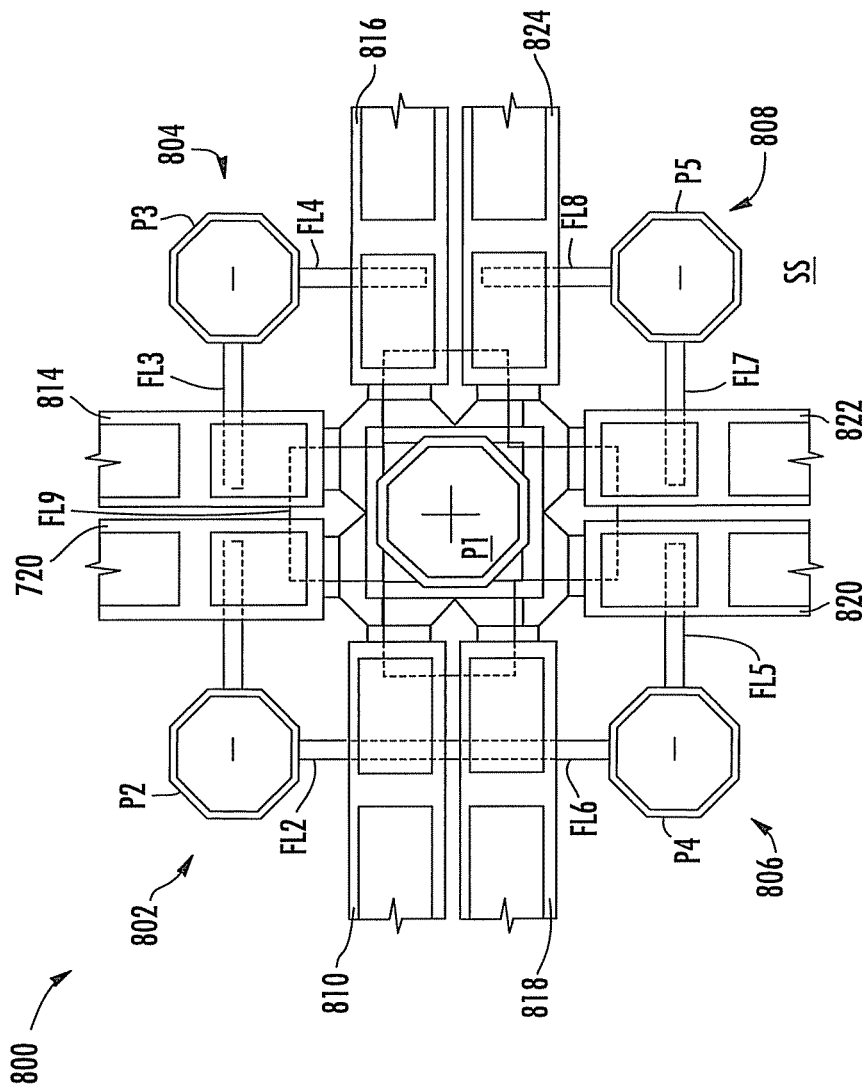
FIG. 8B is a top view of a MEMS variable capacitor system having MEMS variable capacitors and feed lines according to an embodiment of the subject matter described herein.

FIG. 8B is a top view of a MEMS variable capacitor system generally designated 826 having MEMS variable capacitors and feed lines according to an embodiment of the subject matter described herein. System 826 can be similar to system 800 shown in FIG. 8A except that the substrate surface area covered by feed line FL9 in FIG. 8B is smaller.

FIG. 9 is a top view of a MEMS variable capacitor system generally designated 900 having MEMS variable capacitors and feed lines according to an embodiment of the subject matter described herein. Referring to FIG. 9, system 900 can include variable capacitors generally designated 902, 904, 906, and 908. System 900 can include cantilever-type variable capacitors 910 and 912 positioned over feed lines FL1-FL4. In particular, capacitive plate CP of variable capacitor 910 can be positioned over feed lines FL1 and FL3. Capacitive plate CP of variable capacitor 912 can be positioned over feed lines FL2 and FL4. The capacitive plates can be spaced apart from the feed lines in an at least substantially perpendicular direction with respect to substrate surface SS. Feed lines FL1 and FL2 can be connected to feed pad P1. Feed lines FL3 and FL4 can be connected to feed pad P2. Feed pads P1 and P2 can be connected to a signal line. The capacitive plates can be separately moved by application of voltages to variable capacitors 910 and 912 for movement of the variable capacitors such that the capacitances between feed lines FL1/FL2 and feed lines FL3/FL4 are selectively varied.

Variable capacitor 904 can include variable capacitors 914 and 916 having capacitive plates CP positioned above feed lines FL4-FL7. Capacitive plates CP of variable capacitors 914 and 916 can be separately moved by application of voltages to variable capacitors 914 and 916 for movement of components 914 and 916 such that the capacitances between feed lines FL4/FL5 and FL6/FL7 are selectively varied. Feed lines FL5 and FL6 can be connected to feed pad P3. Feed pads P2 and P3 can be connected to a signal line.

Variable capacitor 906 can include variable capacitors 918 and 920 having capacitive plates CP positioned above feed lines FL3, FL8, FL9, and FL10. Capacitive plates CP of variable capacitors 918 and 920 can be separately moved by application of voltages to variable capacitors 918 and 920 for movement of components 918 and 920 such that the capacitances between feed lines FL3/FL8 and FL9/FL10 are selectively varied. Feed lines FL8 and FL9 can be connected to a feed pad P4. Feed lines FL3 and FL10 can be connected to feed pad P2. Feed pads P2 and P4 can be connected to a signal line.

Variable capacitor 908 can include variable capacitors 914 and 916 having capacitive plates CP positioned above feed lines FL4-FL7. Capacitive plates CP of variable capacitors 914 and 916 can be separately moved by application of voltages to variable capacitors 914 and 916 for movement of components 914 and 916 such that the capacitances between feed lines FL4/FL5 and FL6/FL7 are selectively varied. Feed lines FL5 and FL6 can be connected to feed pad P3. Feed pads P2 and P3 can be connected to a signal line.

FIG. 10 is a top view of a MEMS variable capacitor system generally designated 1000 having MEMS variable capacitors and feed lines according to an embodiment of the subject matter described herein. Referring to FIG. 10, system 1000 can include variable capacitors generally designated 1002, 1004, 1006, and 1008. Capacitor 1002 can include cantilever-type variable capacitors 1010 and 1012 positioned over feed lines FL1 and FL2. In particular, capacitive plates CP of variable capacitor 1010 can be positioned over feed lines FL1 and FL2. Capacitive plate CP of variable capacitor 1012 can be positioned over feed lines FL1 and FL2. The capacitive plates can be spaced apart from the feed lines in an at least substantially perpendicular direction with respect to substrate surface SS. Feed lines FL1 and FL2 can be connected to feed pads P1 and P2. Feed pads P1 and P2 can be connected to a signal line. The capacitive plates can be separately moved by application of voltages to variable capacitors 1010 and 1012 for movement of the variable capacitors such that the capacitances between feed lines FL1 and FL2 are selectively varied.

Variable capacitor 1004 can include variable capacitors 1014 and 1016 having capacitive plates CP positioned above feed lines FL2 and FL3. Capacitive plates CP of variable capacitors 1014 and 1016 can be separately moved by application of voltages to variable capacitors 1014 and 1016 for movement of components 1014 and 1016 such that the capacitances between feed lines FL2 and FL3 are selectively varied. Feed line FL3 can be connected to a feed pad P3. Feed pads P2 and P3 can be connected to a signal line.

Variable capacitor 1006 can include variable capacitors 1018 and 1020 having capacitive plates CP positioned above feed lines FL2 and FL3. Capacitive plates CP of variable capacitors 1018 and 1020 can be separately moved by application of voltages to variable capacitors 1018 and 1020 for movement of components 1018 and 1020 such that the capacitances between feed lines FL2 and FL3 are selectively varied. Feed lines FL2 and FL3 can be connected to feed pad P4. Feed pads P2 and P4 can be connected to a signal line.

Variable capacitor 1008 can include variable capacitors 1022 and 1024 having capacitive plates CP positioned above feed lines FL2 and FL3. Capacitive plates CP of variable capacitors 1022 and 1024 can be separately moved by application of voltages to variable capacitors 1022 and 1024 for movement of components 1022 and 1024 such that the capacitances between feed lines FL2 and FL3 are selectively varied. Feed lines FL2 and FL3 can be connected to feed pad P5. Feed pads P2 and P5 can be connected to a signal line.

FIG. 11 is a top view of a MEMS variable capacitor system generally designated 1100 having MEMS variable capacitors and feed lines according to an embodiment of the subject matter described herein. Referring to FIG. 11, system 1100 can include variable capacitors generally designated 1102 and 1104. Capacitor 1102 can include cantilever-type variable capacitors 1106, 1108, 1110, and 1112 positioned over feed lines FL1-FL6. In particular, capacitive plate CP of variable capacitor 1106 can be positioned over feed lines FL1 and FL3. Capacitive plate CP of variable capacitor 1108 can be positioned over feed lines FL1 and FL4. Capacitive plate CP of variable capacitor 1110 can be positioned overfeed lines FL2 and FL5. Capacitive plate CP of variable capacitor 1112 can be positioned over feed lines FL2 and FL6. The capacitive plates can be spaced apart from the feed lines in an at least substantially perpendicular direction with respect to substrate surface SS. Feed lines FL1 and FL2 can be connected to a feed pad P1. Feed lines FL3-FL6 can be connected to a feed pad P2. Feed pads P1 and P2 can be connected to a signal line. The capacitive plates can be separately moved by application of voltages to variable capacitors 1106-1112 for movement of the variable capacitors such that the capacitances between feed pads P1 and P2 are selectively varied.

Variable capacitor 1104 can include cantilever-type variable capacitors 1114, 1116, 1118, and 1120 positioned over-feed lines FL7-FL12. In particular, capacitive plate CP of variable capacitor 1114 can be positioned overfeed lines FL7 and FL9. Capacitive plate CP of variable capacitor 1116 can be positioned over feed lines FL7 and FL40. Capacitive plate CP of variable capacitor 1118 can be positioned over feed lines FL8 and FL11. Capacitive plate CP of variable capacitor 1120 can be positioned over feed lines FL8 and FL12. The capacitive plates can be spaced apart from the feed lines in an at least substantially perpendicular direction with respect to substrate surface SS. Feed lines FL7 and FL8 can be connected to a feed pad P3. Feed lines FL3-FL6 can be connected to a feed pad P3. Feed pads P1 and P3 can be connected to a signal line. The capacitive plates can be separately moved by application of voltages to variable capacitors 1114-1120 for movement of the variable capacitors such that the capacitances between feed pads P1 and P3 are selectively varied.

FIG. 12 is a top view of a MEMS variable capacitor system generally designated 1200 having MEMS variable capacitors and feed lines according to an embodiment of the subject matter described herein. Referring to FIG. 12, system 1200 can include cantilever-type variable capacitors generally designated 1202, 1204, 1206, and 1208. Variable capacitor 1202 can include variable capacitors VC1 and VC2 positioned above feed lines FL1-FL4. In particular, capacitive plates CP of variable capacitor VC1 can be disposed over feed lines FL1 and FL3. Capacitive plates CP of variable capacitor VC2 can be disposed over feed lines FL2 and FL4. The capacitive plates can be spaced apart from the feed lines in an at least substantially perpendicular direction with respect to substrate surface SS. Feed lines FL1 and FL2 can be connected to feed pad P1. Feed lines FL3 and FL4 can be connected to feed pad P2. Feed pads P1 and P2 can be connected to a signal line. The capacitive plates can be separately moved by application of voltages to variable capacitors for movement of the variable capacitors such that the capacitances between feed pads P1 and P2 are selectively varied.

Variable capacitor 1204 can include variable capacitors VC3 and VC4 positioned above feed lines FL3-FL6. In particular, capacitive plates CP of variable capacitor VC3 can be disposed over feed lines FL3 and FL5. Capacitive plates CP of variable capacitor VC4 can be disposed over feed lines FL4 and FL6. The capacitive plates can be spaced apart from the feed lines in an at least substantially perpendicular direction with respect to substrate surface SS. Feed lines FL5 and FL6 can be connected to a feed pad P3. Feed pads P2 and P3 can be connected to a signal line. The capacitive plates can be separately moved by application of voltages to variable capacitors for movement of the variable capacitors such that the capacitances between feed pads P2 and P3 are selectively varied.

Variable capacitor 1206 can include variable capacitors VC5 and VC6 positioned above feed lines FL5-FL8. In particular, capacitive plates CP of variable capacitor VC5 can be disposed over feed lines FL5 and FL7. Capacitive plates CP of variable capacitor VC7 can be disposed overfeed lines FL6 and FL8. The capacitive plates can be spaced apart from the feed lines in an at least substantially perpendicular direction with respect to substrate surface SS. Feed lines FL5 and FL6 can be connected to feed pad P3. Feed lines FL7 and FL8 can be connected to feed pad P4. Feed pads P3 and P4 can be connected to a signal line. The capacitive plates can be separately moved by application of voltages to variable capacitors for movement of the variable capacitors such that the capacitances between feed pads P3 and P4 are selectively varied.

Variable capacitor 1208 can include variable capacitors VC7 and VC8 positioned above feed lines FL7-FL10. In particular, capacitive plates CP of variable capacitor VC7 can be disposed over feed lines FL7 and FL9. Capacitive plates CP of variable capacitor VC8 can be disposed over feed lines FL8 and FL10. The capacitive plates can be spaced apart from the feed lines in an at least substantially perpendicular direction with respect to substrate surface SS. Feed lines FL7 and FL8 can be connected to feed pad P4. Feed lines FL9 and FL10 can be connected to feed pad P5. Feed pads P4 and P5 can be connected to a signal line. The capacitive plates can be separately moved by application of voltages to variable capacitors for movement of the variable capacitors such that the capacitances between feed pads P4 and P5 are selectively varied.

Figure 13:
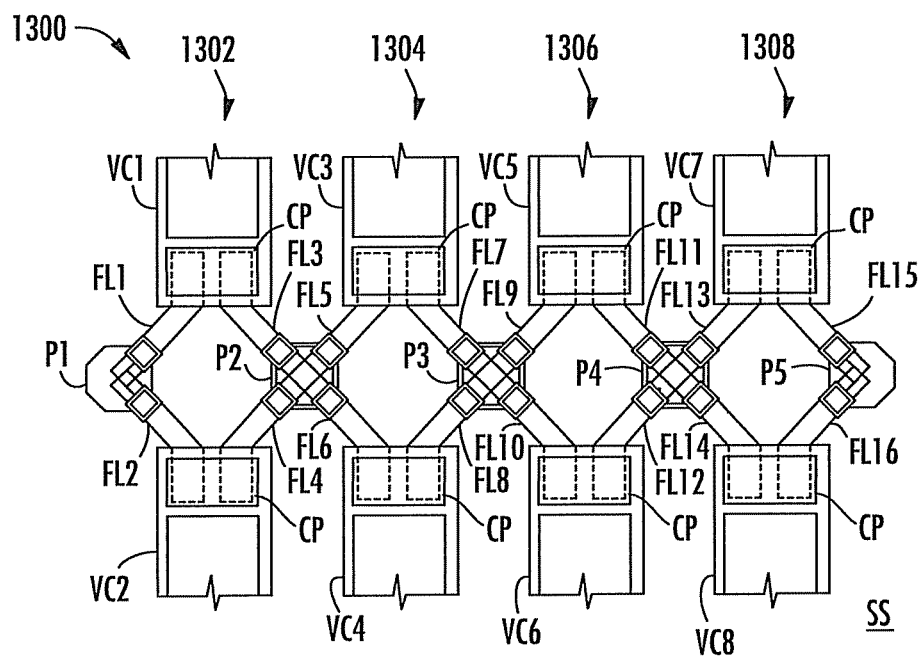
FIG. 13 is a top view of a MEMS variable capacitor system having MEMS variable capacitors and feed lines according to an embodiment of the subject matter described herein.

FIG. 13 is a top view of a MEMS variable capacitor system generally designated 1300 having MEMS variable capacitor variable capacitors and feed lines according to an embodiment of the subject matter described herein. Referring to FIG. 13, system 1300 can include cantilever-type variable capacitors generally designated 1302, 1304, 1306, and 1308. Variable capacitor 1302 can include variable capacitors VC1 and VC2 positioned above feed lines FL1-FL4. In particular, capacitive plates CP of variable capacitor VC1 can be disposed over feed lines FL1 and FL3. Capacitive plates CP of variable capacitor VC2 can be disposed over feed lines FL2 and FL4. The capacitive plates can be spaced apart from the feed lines in an at least substantially perpendicular direction with respect to substrate surface SS. Feed lines FL1 and FL2 can be connected to feed pad P1. Feed lines FL3 and FL4 can be connected to feed pad P2. Feed pads P1 and P2 can be connected to a signal line. The capacitive plates can be separately moved by application of voltages to variable capacitors for movement of the variable capacitors such that the capacitances between feed pads P1 and P2 are selectively varied.

Variable capacitor 1304 can include variable capacitors VC3 and VC4 positioned above feed lines FL5-FL8. In particular, capacitive plates CP of variable capacitor VC3 can be disposed over feed lines FL5 and FL7. Capacitive plates CP of variable capacitor VC4 can be disposed over feed lines FL6 and FL8. The capacitive plates can be spaced apart from the feed lines in an at least substantially perpendicular direction with respect to substrate surface SS. Feed lines FL5 and FL6 can be connected to feed pad P2. Feed lines FL7 and FL8 can be connected to a feed pad P3. Feed pads P2 and P3 can be connected to a signal line. The capacitive plates can be separately moved by application of voltages to variable capacitors for movement of the variable capacitors such that the capacitances between feed pads P2 and P3 are selectively varied.

Variable capacitor 1306 can include variable capacitors VC5 and VC6 positioned above feed lines FL9-FL12. In particular, capacitive plates CP of variable capacitor VC5 can be disposed over feed lines FL9 and FL11. Capacitive plates CP of variable capacitor VC6 can be disposed over feed lines FL10 and FL12. The capacitive plates can be spaced apart from the feed lines in an at least substantially perpendicular direction with respect to substrate surface SS. Feed lines FL9 and FL10 can be connected to feed pad P3. Feed lines FL11 and FL12 can be connected to a feed pad P4. Feed pads P3 and P4 can be connected to a signal line. The capacitive plates can be separately moved by application of voltages to variable capacitors for movement of the variable capacitors such that the capacitances between feed pads P3 and P4 are selectively varied.

Variable capacitor 1308 can include variable capacitors VC7 and VC8 positioned above feed lines FL13-FL16. In particular, capacitive plates CP of variable capacitor VC7 can be disposed over feed lines FL13 and FL15. Capacitive plates CP of variable capacitor VC8 can be disposed over feed lines FL24 and FL16. The capacitive plates can be spaced apart from the feed lines in an at least substantially perpendicular direction with respect to substrate surface SS. Feed lines FL13 and FL14 can be connected to feed pad P4. Feed lines FL15 and FL16 can be connected to a feed pad P5. Feed pads P4 and P5 can be connected to a signal line. The capacitive plates can be separately moved by application of voltages to variable capacitors for movement of the variable capacitors such that the capacitances between feed pads P4 and P5 are selectively varied.

Figure 14:
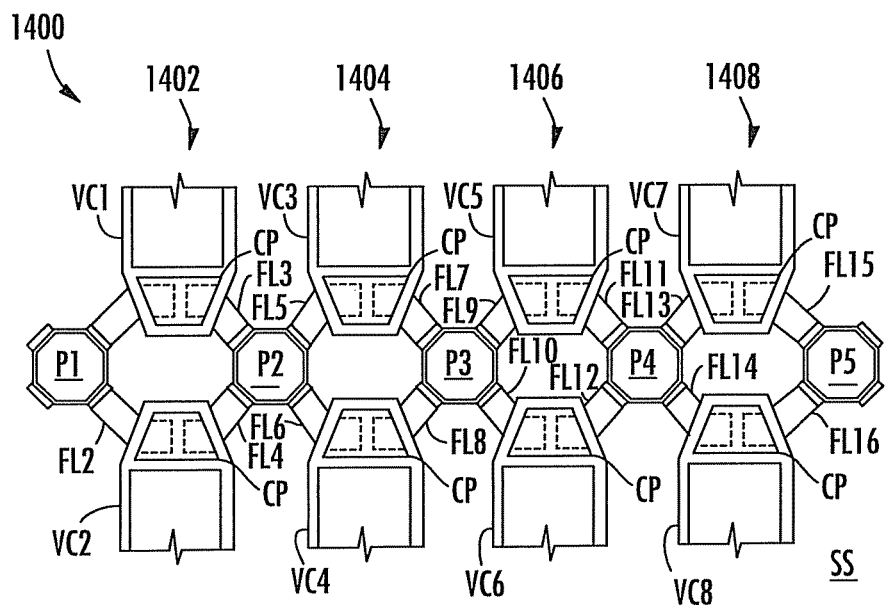
FIG. 14 is a top view of a MEMS variable capacitor system having MEMS variable capacitors and feed lines according to an embodiment of the subject matter described herein.

FIG. 14 is a top view of a MEMS variable capacitor system generally designated 1400 having MEMS variable capacitors and feed lines according to an embodiment of the subject matter described herein. Referring to FIG. 13, system 1400 can include cantilever-type variable capacitors generally designated 1402, 1404, 1406, and 1408. In this embodiment, capacitive plates CP can be trapezoidal in shape and positioned for minimizing the substrate surface area covered by variable capacitors 1402, 1404, 1406, and 1408.

Variable capacitor 1402 can include variable capacitors VC1 and VC2 positioned above feed lines FL1-FL4. In particular, capacitive plates CP of variable capacitor VC1 can be disposed over feed lines FL1 and FL3. Capacitive plates CP of variable capacitor VC2 can be disposed over feed lines FL2 and FL4. The capacitive plates can be spaced apart from the feed lines in an at least substantially perpendicular direction with respect to substrate surface SS. Feed lines FL1 and FL2 can be connected to feed pad P1. Feed lines FL3 and FL4 can be connected to feed pad P2. Feed pads P1 and P2 can be connected to a signal line. The capacitive plates can be separately moved by application of voltages to variable capacitors for movement of the variable capacitors such that the capacitances between feed pads P1 and P2 are selectively varied.

Variable capacitor 1404 can include variable capacitors VC3 and VC4 positioned above feed lines FL5-FL8. In particular, capacitive plates CP of variable capacitor VC3 can be disposed over feed lines FL5 and FL7. Capacitive plates CP of variable capacitor VC4 can be disposed over feed lines FL6 and FL8. The capacitive plates can be spaced apart from the feed lines in an at least substantially perpendicular direction with respect to substrate surface SS. Feed lines FL5 and FL6 can be connected to feed pad P2. Feed lines FL7 and FL8 can be connected to a feed pad P3. Feed pads P2 and P3 can be connected to a signal line. The capacitive plates can be separately moved by application of voltages to variable capacitors for movement of the variable capacitors such that the capacitances between feed pads P2 and P3 are selectively varied.

Variable capacitor 1406 can include variable capacitors VC5 and VC6 positioned above feed lines FL9-FL12. In particular, capacitive plates CP of variable capacitor VC5 can be disposed over feed lines FL9 and FL11. Capacitive plates CP of variable capacitor VC6 can be disposed over feed lines FL10 and FL12. The capacitive plates can be spaced apart from the feed lines in an at least substantially perpendicular direction with respect to substrate surface SS. Feed lines FL9 and FL10 can be connected to feed pad P3. Feed lines FL11 and FL12 can be connected to a feed pad P4. Feed pads P3 and P4 can be connected to a signal line. The capacitive plates can be separately moved by application of voltages to variable capacitors for movement of the variable capacitors such that the capacitances between feed pads P3 and P4 are selectively varied.

Variable capacitor 1408 can include variable capacitors VC7 and VC8 positioned above feed lines FL13-FL16. In particular, capacitive plates CP of variable capacitor VC7 can be disposed over feed lines FL13 and FL15. Capacitive plates CP of variable capacitor VC8 can be disposed over feed lines FL24 and FL16. The capacitive plates can be spaced apart from the feed lines in an at least substantially perpendicular direction with respect to substrate surface SS. Feed lines FL13 and FL14 can be connected to feed pad P4. Feed lines FL15 and FL16 can be connected to a feed pad P5. Feed pads P4 and P5 can be connected to a signal line. The capacitive plates can be separately moved by application of voltages to variable capacitors for movement of the variable capacitors such that the capacitances between feed pads P4 and P5 are selectively varied.

In one embodiment, a MEMS variable capacitor system according to the subject matter described herein can include a first feed line being positioned on a first defined area. Second, third, fourth, and fifth feed lines can be positioned on a plurality of second defined areas that substantially surround the first defined area. First, second, third, and fourth actuation components can include capacitive plates spaced apart from the first feed line. The capacitive plates of the first, second, third, and fourth actuation components can be connected to the second, third, fourth, and fifth feed lines, respectively. Each of the capacitive plates can be separately movable with respect to the first feed line for varying the capacitance between the first feed line and the respective one of the second, third, fourth, and fifth feed lines over a predetermined capacitance range. An example of this system is provided in FIG. 15.

Figure 15:
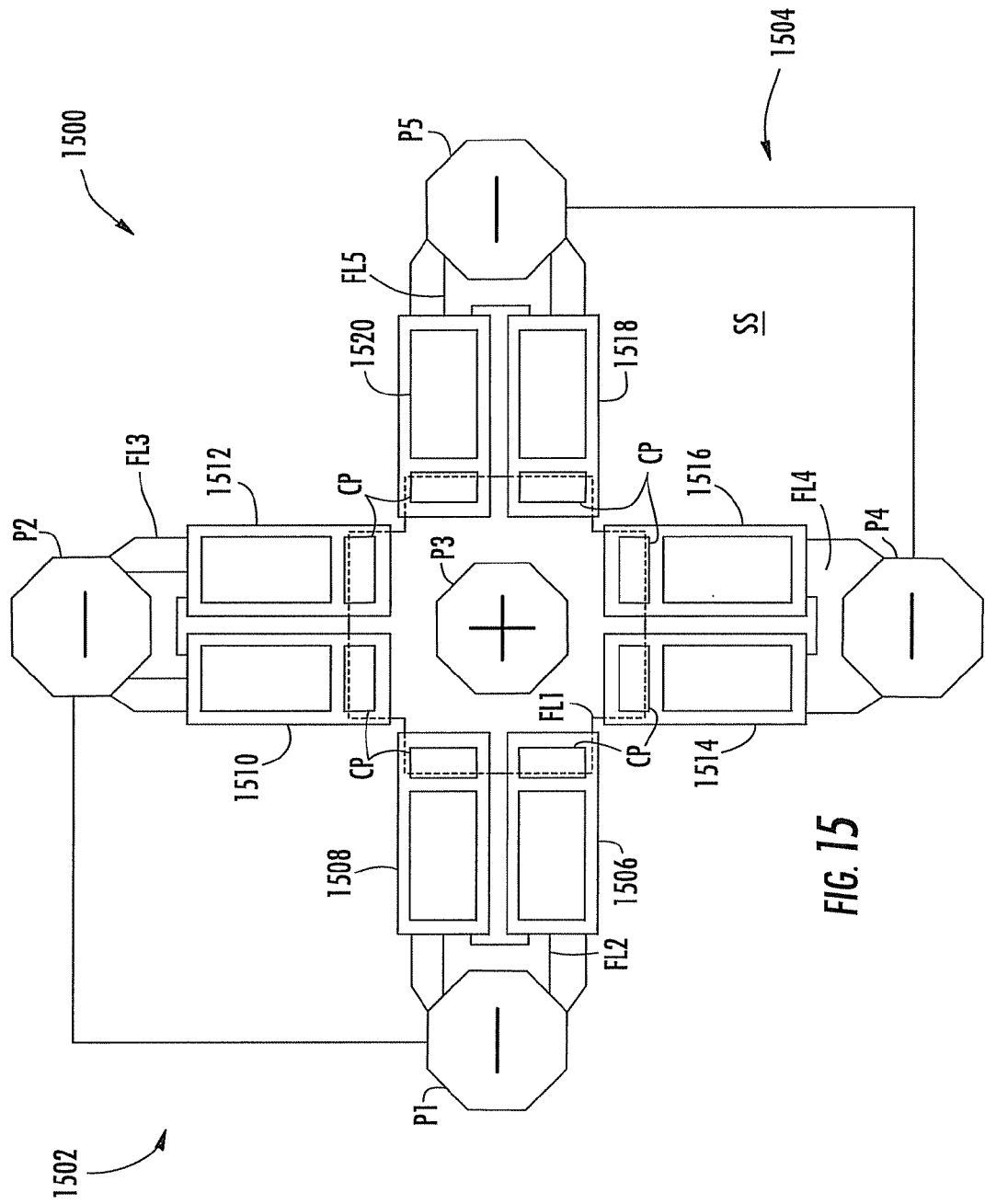
FIG. 15 is a top view of a MEMS variable capacitor system having MEMS variable capacitors and feed lines according to an embodiment of the subject matter described herein.

FIG. 15 is a top view of a MEMS variable capacitor system generally designated 1500 having MEMS variable capacitors and feed lines according to an embodiment of the subject matter described herein. Referring to FIG. 15, system 1500 can include cantilever-type variable capacitors generally designated 1502 and 1504. Variable capacitor 1502 can include variable capacitors 1506, 1508, 1510, and 1512 positioned over feed line FL1. In particular, capacitive plates CP of variable capacitors 1506, 1508, 1510, and 1512 can be positioned over feed line FL1. Capacitive plates CP of variable capacitors 1506 and 1508 can be connected by a split feed line FL2 to a feed pad P1. Capacitive plates CP of variable capacitors 1510 and 1512 can be connected by a split feed line FL3 to a feed pad P2. Feed line FL1 can be connected to a feed pad P3. Feed pads P1 and P2 can be connected to one terminal of a signal line. Feed pad P3 can be connected to the other terminal of the signal line. The capacitive plates can be separately moved by application of voltages to variable capacitors for movement of the variable capacitors such that the capacitance applied to the signal line is selectively varied.

Variable capacitor 1504 can include variable capacitors 1514, 1516, 1518, and 1520 positioned over feed line FL1. In particular, capacitive plates CP of variable capacitors 1514, 1516, 1518, and 1520 can be positioned over feed line FL1. Capacitive plates CP of variable capacitors 1514 and 1516 can be connected by a split feed line FL4 to a feed pad P4. Capacitive plates CP of variable capacitors 1518 and 1520 can be connected by a split feed line FL5 to a feed pad P5. Feed pads P4 and P5 can be connected to one terminal of a signal line. Feed pad P3 can be connected to the other terminal of the signal line. The capacitive plates can be separately moved by application of voltages to variable capacitors for movement of the variable capacitors such that the capacitance applied to the signal line is selectively varied.

Shielding

Shielding can be provided within a substrate and positioned for reducing RF interference and/or loss coupled to and/or from the substrate and/or underlying circuitry. In one embodiment, a MEMS variable capacitor can include a substrate having a surface. First and second feed lines can extend on the surface of the substrate. First and second capacitive plates can be spaced apart from the first and second feed lines. The first and second capacitive plates can be separately movable with respect to at least one of the first and second feed lines for varying the capacitance between the first and second feed lines over a predetermined capacitance range. A shielding material can be positioned within the substrate and positioned in an area substantially beneath the feed lines, feed pads, and capacitive plates for reducing RF interference and/or loss coupled to/from the substrate and/or underlying circuitry.

FIGS. 16A and 16B illustrate a top view and a perspective view, respectively, of a MEMS variable capacitor generally designated 1600 having a shielding SH according to an embodiment of the subject matter described herein. Referring to FIGS. 16A and 16B, capacitor 1600 can include feed lines FL1 and FL2 connected to feed pads P1-P3. Feed pads P1-P3 can be connected together to a terminal of a signal line. Further, feed lines P4-P6 can be connected to feed pads P4-P6. Feed pads P4-P6 can be connected together to the other terminal of the signal line. Capacitive plates CP can be positioned above feed lines FL1 and FL2. Further, capacitive plates CP can be attached to a cantilever-type variable capacitor or a bridge-type variable capacitor as described herein for movement of capacitive plates CP with respect to feed lines FL1 and FL2. Capacitive plates CP can be moved individually or together for varying the capacitance applied to the terminals of the signal line as described herein.

Shield SH can be positioned beneath capacitive plates CP, feed lines FL1-FL6, and feed pads P1-P6. Shield SH can be a ground metal shielding for reducing RF interference. Further, shield SH can reduce loss coupled to a lossy substrate, such as a silicon substrate. A similar shield can be positioned beneath the capacitive plates, feed lines, and feed pads described in the embodiment for reducing RF interference and loss coupled to a substrate. The shielding material can be connected to one or more feed lines for functioning as a grounded shield. The precise extent of the shield required will be determined by the substrate properties, the distance of the feed lines and pads from the substrate and the distance of the shield from the substrate. The shield does not need to be solid and may have slots or holes.

FIG. 16C illustrates a perspective view of MEMS variable capacitor generally designated 1600 having a contouring shielding SH according to an embodiment of the subject matter described herein. Referring to FIG. 16C, capacitor 1600 can be contoured to the shape of capacitive plates CP, feed lines FL1-FL6, and feed pads P1-P6.

Simulation Result Graphs

Simulations were performed of some of the MEMS variable capacitors and variable capacitor systems described herein. The simulations were performed using computer simulation software available from Ansoft Corporation, of Pittsburgh, Pa.

Figures 17C, 17D:
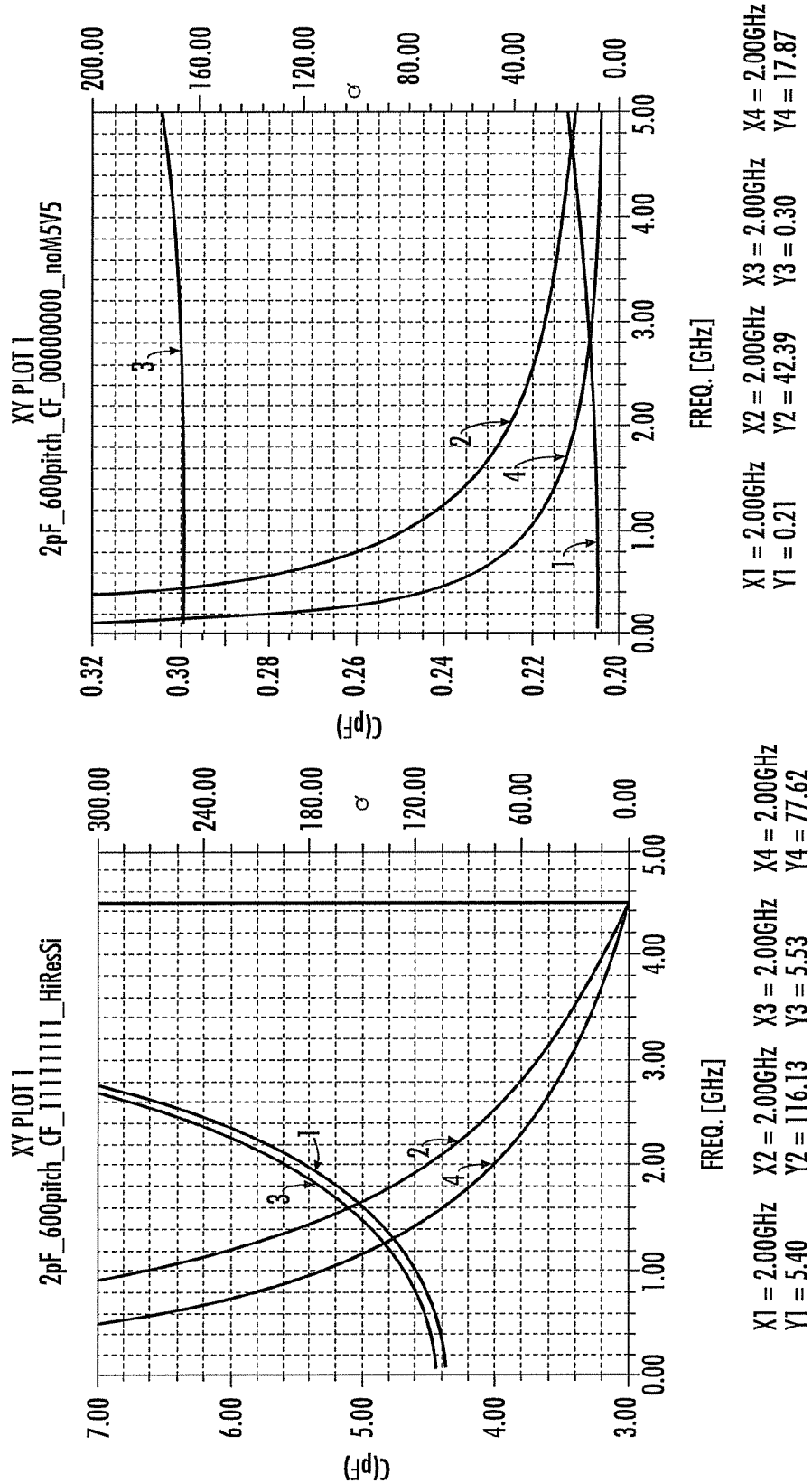
Figures 17E, 18A:
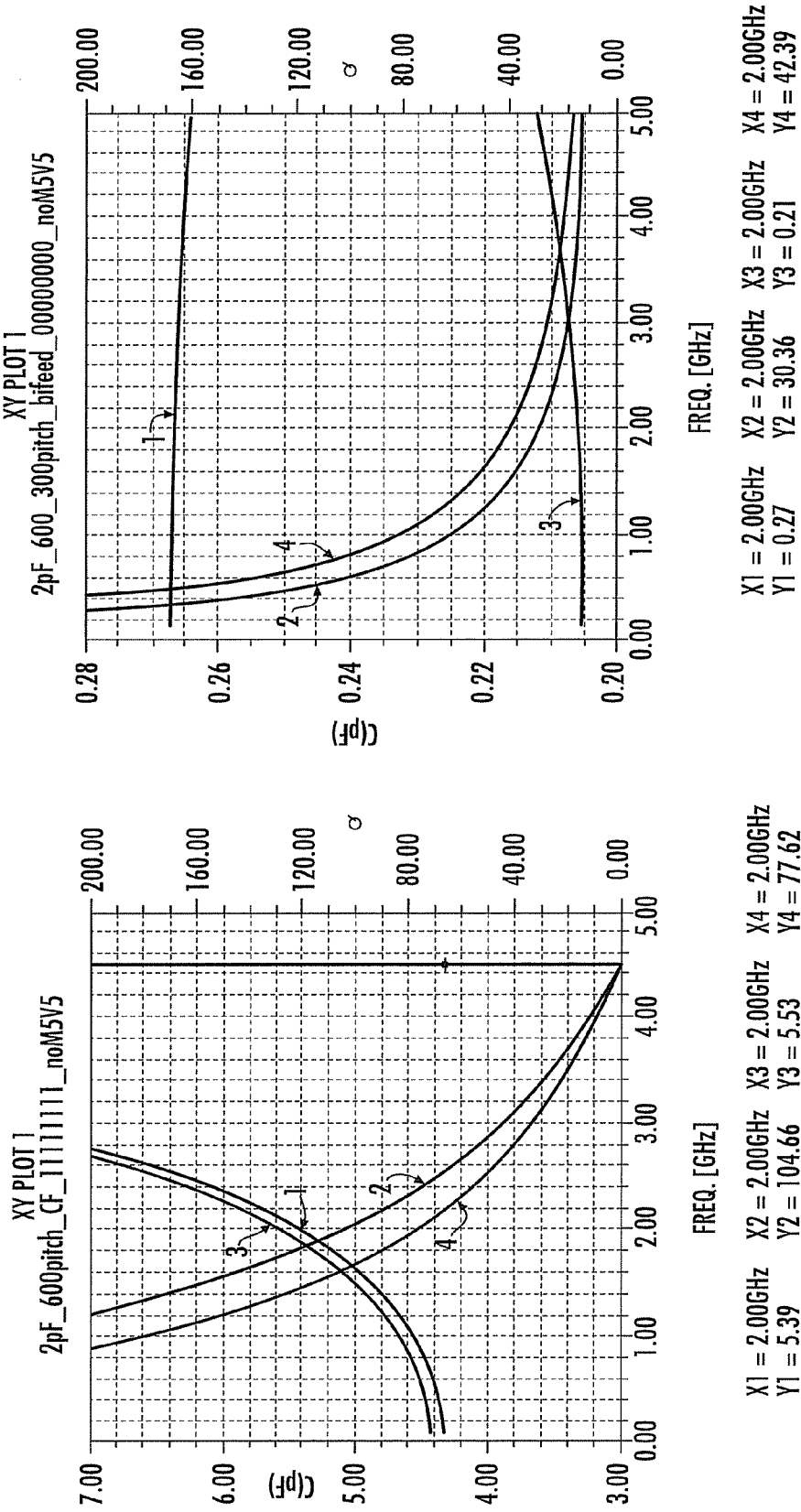

FIGS. 17A-17E are graphs illustrating simulation results of capacitor system 500 shown in FIG. 5. Referring to FIGS. 17A-17E, capacitance and Q obtained by system 500 is shown over a range of frequencies. FIG. 17A is a baseline simulation of all capacitor bits closed (1 for capacitance, 2 for Q) and open (3 for capacitance, 4 for Q) without a shield. The closed Q is marginal but the open Q is terrible. FIGS. 17B and 17C compare the results of using a very low loss substrate to the baseline showing the very high Q and low minimum capacitance achieved. FIG. 17B is for all actuators up, and FIG. 17C is all down. However, use of such a low-loss (high resistivity) substrate is often not practical, especially when integrating with semiconductor-based circuits. In FIGS. 17D and 17E, a similar comparison is made between the baseline and a modified feed structure used to reduce losses and parasitic capacitance for open and closed cases, respectively.

Figures 18D, 19A:
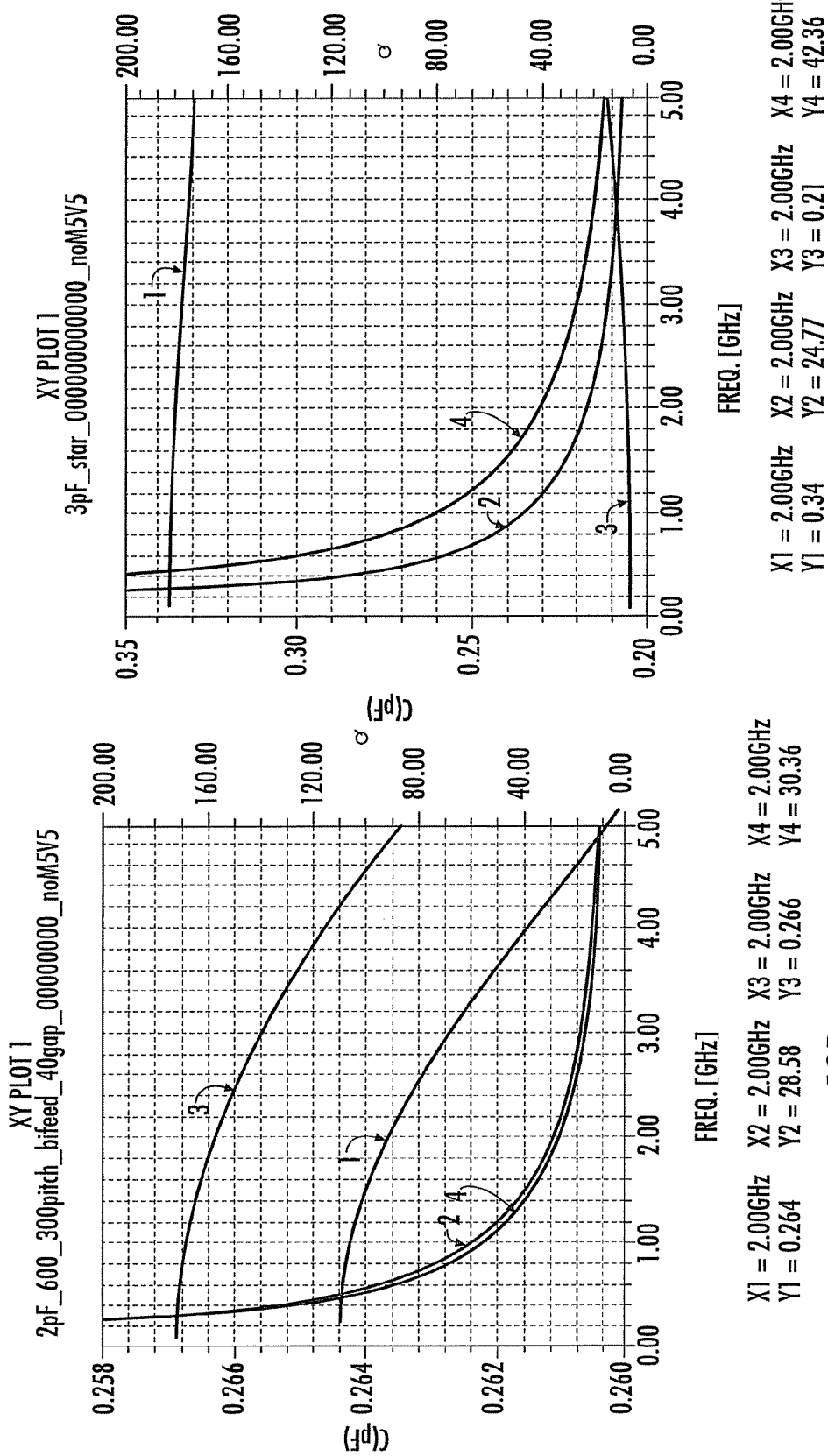

FIGS. 18A-18D are graphs illustrating simulation results of capacitor system 600 shown in FIG. 6. Referring to FIGS. 18A-18D, capacitance and Q obtained by system 600 is shown over a range of frequencies. These figures compare the improvement due to the bi-feed over the other baseline. FIG. 18A is the minimum capacitance case, and FIG. 18B is the closed case. FIG. 18B shows the improved Q and higher self-resonant frequency of this feed. (capacitance is more stable with frequency). In FIG. 18C, the pads are reduced to half area to measure the contribution of the pads to the parasitic capacitance (2×0.03 pF=0.06 pF). FIG. 18D examines the effect of modifying the lateral gap between the feed lines. For this set of material and design parameters, larger gaps lead to higher loss. This implies that the substrate currents are limited by the capacitance to the substrate. For very resistivity substrates or very high capacitances to the substrate, this trend will be reversed.

Figures 19D, 19E:
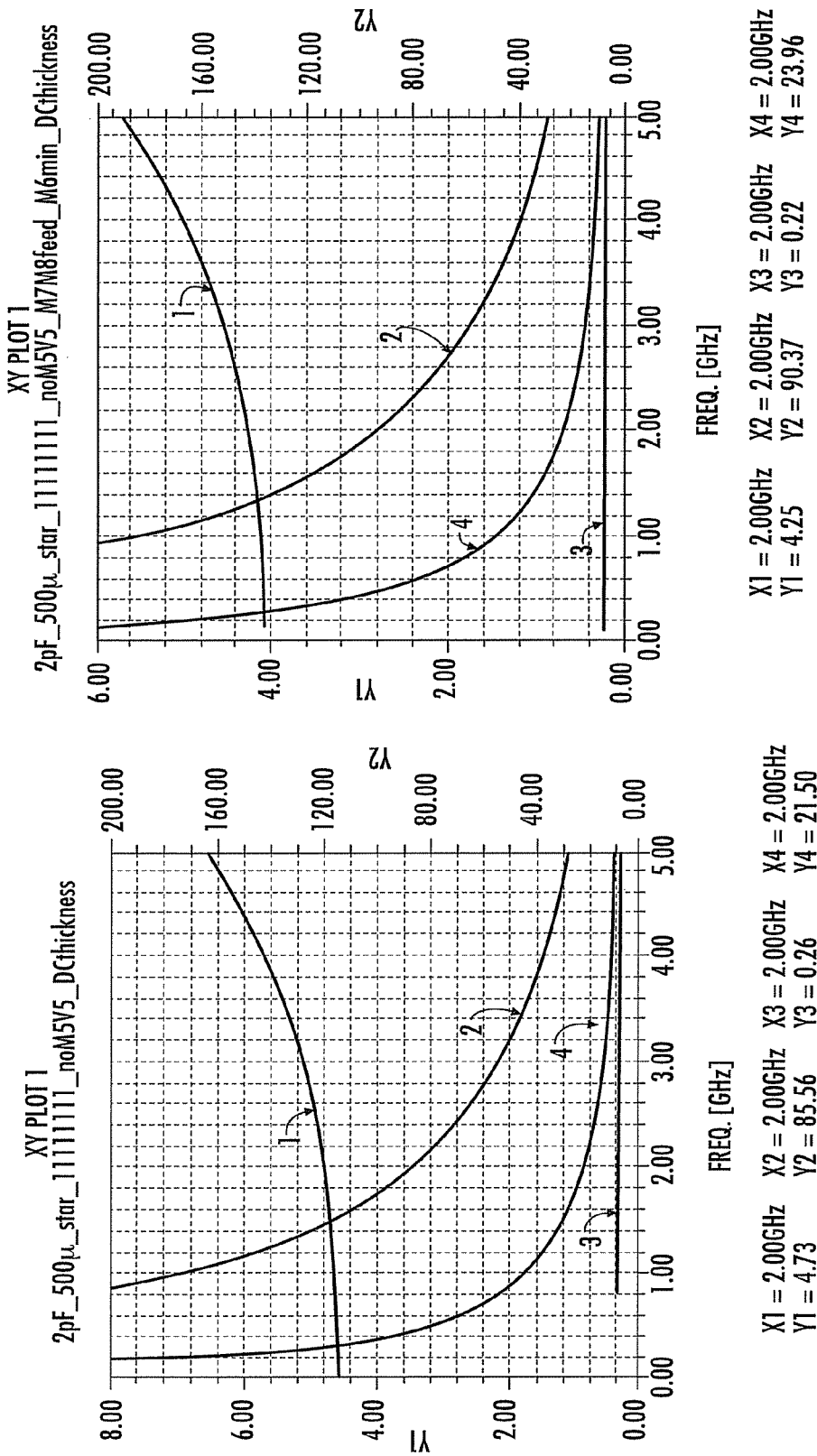

FIGS. 19A-19E are graphs illustrating simulation results of capacitor system 700 shown in FIG. 7. Referring to FIGS. 19A-19E, capacitance and Q obtained by system 700 is shown over a range of frequencies. FIG. 19A compares the performance of this design to the baseline for the open case, and FIG. 19B for the corresponding all-closed case. FIGS. 19C and 19D contrast two different simulation assumptions for the capacitor system 700 shown in FIG. 7 (maybe we should leave these out . . . ). FIG. 19E shows the all-up and all-down results capacitor system 700 shown in FIG. 7 where the feeds have been modified to minimize the parasitic capacitance to the substrate by using metal layers further from the substrate where possible and minimizing the feed area. This mostly improves the all-up performance.

FIG. 20 is a graph illustrating simulation results of capacitor system 1100 shown in FIG. 11. Referring to FIG. 20, capacitance and Q obtained by system 1100 is shown over a range of frequencies. This 3 pad feed version should be compared to the version with results in FIGS. 19A-19E. This will have somewhat worse performance but better area usage.

FIG. 21 is a graph illustrating simulation results of capacitor system 1500 shown in FIG. 15. Referring to FIG. 21, capacitance and Q obtained by system 1500 is shown over a range of frequencies. This is the top-fed device. This design will take up much less area for the same capacitance than the versions with floating capacitor electrode. However, it may have worse RF performance and may couple more RF to the control electrodes and control lines.

FIG. 22 is a graph illustrating simulation results of capacitor system 1200 shown in FIG. 12. Referring to FIG. 22, capacitance and Q obtained by system 1200 is shown over a range of frequencies. These all-open and all-closed results are for feed networks that are more suitable for dense array utilizing cantilever actuators. High ratio and Q results are obtained.

Figures 23B, 24:
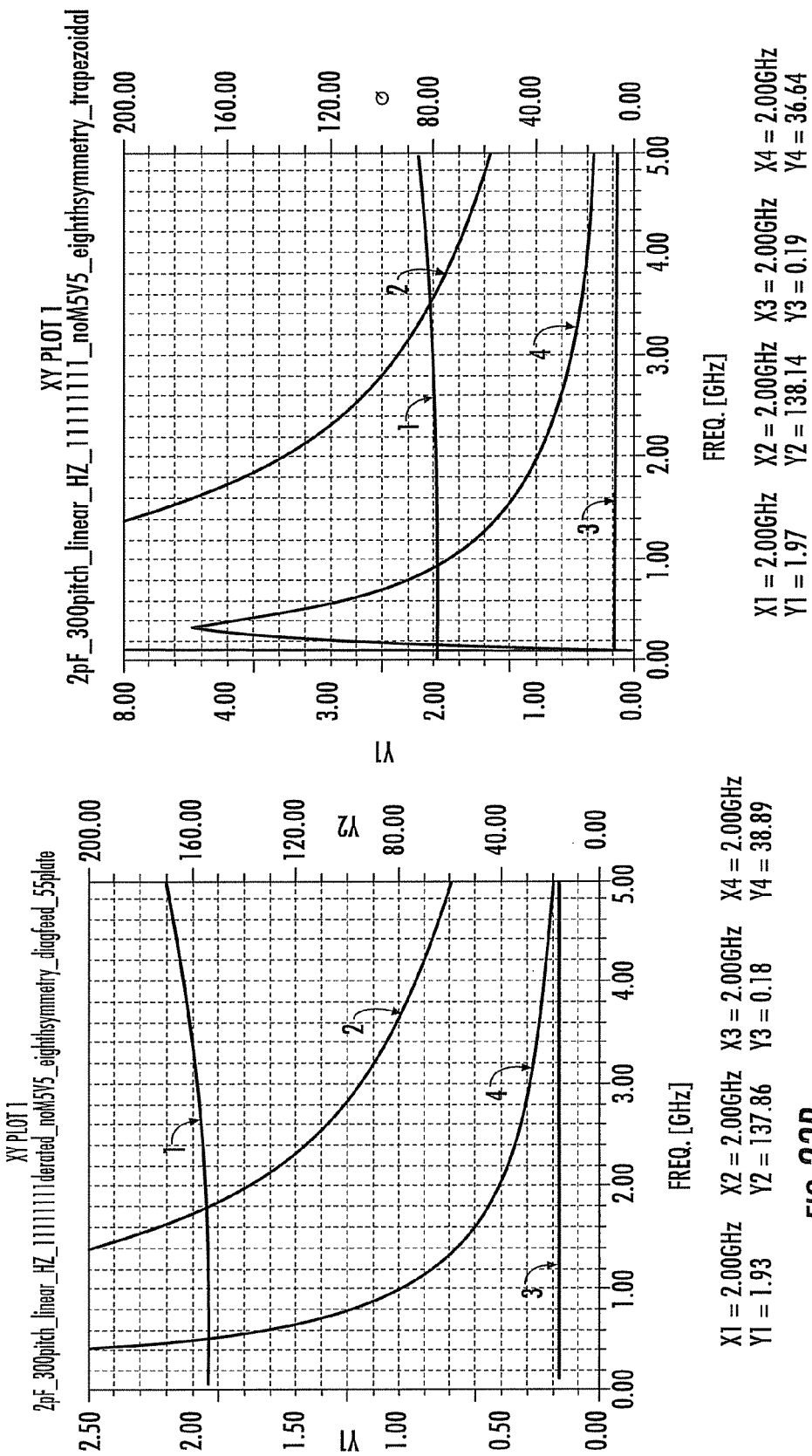

FIGS. 23A and 23B are graphs illustrating simulation results of capacitor system 1300 shown in FIG. 13. Referring to FIGS. 23A and 23B, capacitance and Q obtained by system 1300 is shown over a range of frequencies. Showing the improved performance with the improved packing density that this diagonal feed design provides compared to FIG. 12.

FIG. 24 is a graph illustrating simulation results of capacitor system 1400 shown in FIG. 14. Referring to FIG. 24, capacitance and Q obtained by system 1400 is shown over a range of frequencies. These figures show improvement with trapezoidal shaped capacitance plates.

A simulation was performed of MEMS variable capacitor 1600 with shielding at different distances for determining the effect that the shielding has at different distances. In the simulations, shield SH was positioned at 7.3 and 11.2 μm away from capacitive plates CP, feed lines FL1-FL6, and feed pads P1-P6. Table 1 below shows shielding simulation results when the shield at these positions.

TABLE 1

| | Shielding Simulation Results | | | |
|---|---|---|---|---|
| | Shield 11.2 μm Away | | Shield 7.3 μm Away | |
| | All Caps Activated | No Cap Activated | All Caps Activated | No Cap Activated |
| Q (2 GHz) | 540 | 51 | 450 | 48 |
| C (pf) (2 GHz) | 0.34 | 4.57 | 0.450 | 4.70 |

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A micro-electro-mechanical system (MEMS) variable capacitor comprising:
   a substrate comprising a semiconductor material, the substrate including a surface;
   first and second feed lines extending on the surface of the substrate;
   a first capacitive plate spaced apart from the first and second feed lines and movable with respect to the first and second feed lines; and
   a second capacitive plate spaced apart from the first and second feed lines and movable separately from the first capacitive plate with respect to the first and second feed lines, wherein the first and second capacitive plates are separately movable with respect to the first and second feed lines for varying the capacitance between the first and second feed lines over a predetermined capacitance range;
   first and second actuation components being movable with respect to the first and second feed lines, wherein the first and second capacitive plates are attached to the first and second actuation components, respectively; and
   a shielding material positioned within the substrate and in an area substantially beneath the feed lines and capacitive plates but not beneath the first and second actuation components, the shielding material having a shape that is contoured to substantially match a shape of the first and second feed lines and of the first and second capacitive plates for reducing one of RF interference and loss coupled to the semiconducting material of the substrate.

2. The MEMS variable capacitor of claim 1 wherein the first and second feed lines are connected to first and second feed pads, respectively, and wherein the shielding material is positioned in an area substantially beneath the first and second feed pads.

3. The MEMS variable capacitor of claim 2, further comprising:
   third and fourth feed lines connected to first and second feed pads, respectively;
   a third capacitive plate spaced apart from the third and fourth feed lines and movable with respect to the third and fourth feed lines; and
   a fourth capacitive plate spaced apart from the third and fourth feed lines and movable separately from the third capacitive plate with respect to the third and fourth feed lines, wherein the third and fourth capacitive plates are separately movable with respect to the third and fourth feed lines for varying the capacitance between the third and fourth feed lines over a predetermined capacitance range;
   wherein the shielding material is positioned in an area substantially beneath the third and fourth feed lines and the third and fourth capacitive plates.

4. The MEMS variable capacitor of claim 1 wherein the shielding material is connected to at least one of the first and second feed lines.

5. The MEMS variable capacitor of claim 1 wherein the shielding material is connected to a ground.

6. The MEMS variable capacitor of claim 1 wherein the shielding material is a CMOS interconnect metal.

7. The MEMS variable capacitor of claim 1 wherein the shielding material is a layer within the substrate between the feed lines and the semiconductor material.

8. The MEMS variable capacitor of claim 1 wherein the shielding material has a size and shape substantially equal to or greater than a size and shape of the first and second feed lines, the first capacitive plate, and the second capacitive plate.

9. The MEMS variable capacitor of claim 1 wherein the semiconductor material comprises silicon.

10. The MEMS variable capacitor of claim 1 wherein the shielding material is positioned at least 7.3 μm beneath the feed lines and capacitive plates.

11. The MEMS variable capacitor of claim 1 wherein the shape of the shielding material is configured to be different from the shape of the first and second feed lines and of the first and second capacitive plates based on one or more of properties of the substrate, a distance of the first and second feed lines from the substrate, or a distance of the shielding material from the substrate.

* * * * *